US012751223B2

(12) United States Patent
Kao et al.

(10) Patent No.: US 12,751,223 B2
(45) Date of Patent: Sep. 29, 2026

(54) TREATMENT TO CONTROL DEPOSITION RATE

(71) Applicant: Taiwan Semiconductor Manufacturing Co., Ltd., Hsinchu (TW)

(72) Inventors: Wan-Yi Kao, Baoshan Township (TW); Kuang-Yuan Hsu, Taichung City (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1046 days.

(21) Appl. No.: 17/749,324

(22) Filed: May 20, 2022

(65) Prior Publication Data

US 2022/0277956 A1 Sep. 1, 2022

Related U.S. Application Data

(60) Continuation of application No. 16/569,953, filed on Sep. 13, 2019, now Pat. No. 11,342,177, which is a division of application No. 16/051,064, filed on Jul. 31, 2018, now Pat. No. 10,867,789, which is a division of application No. 14/942,407, filed on Nov. 16, 2015, now Pat. No. 10,388,515.

(51) Int. Cl.

| | |
|---|---|
| ***H10P 14/60*** | (2026.01) |
| ***C23C 16/02*** | (2006.01) |
| ***H10P 14/694*** | (2026.01) |
| ***H10P 76/40*** | (2026.01) |
| *H10D 30/01* | (2025.01) |

(52) U.S. Cl.

CPC .......... *H10P 14/6512* (2026.01); *C23C 16/02* (2013.01); *H10P 14/6339* (2026.01); *H10P 14/6682* (2026.01); *H10P 14/69433* (2026.01); *H10P 76/405* (2026.01); *H10D 30/024* (2025.01)

(58) Field of Classification Search

CPC ........... H01L 21/02312; H01L 21/0228; H10P 14/6339; H10P 14/6512–6514

See application file for complete search history.

(56) References Cited

U.S. PATENT DOCUMENTS

| | | | |
|---|---|---|---|
| 6,987,073 | B2 | 1/2006 | Mercaldi |
| 7,402,534 | B2 | 7/2008 | Mahajani |
| 8,138,104 | B2 | 3/2012 | Balseanu et al. |

(Continued)

FOREIGN PATENT DOCUMENTS

| | | | |
|---|---|---|---|
| DE | 10052680 | A1 | 5/2002 |
| KR | 20040087310 | A | 10/2004 |

(Continued)

*Primary Examiner* — Daniel Luke

(74) *Attorney, Agent, or Firm* — Slater Matsil, LLP

(57) ABSTRACT

A treatment, structure and system are provided that modify the deposition process of a material that can occur over two differing materials. In an embodiment the deposition rates may be adjusted by the treatment to change the deposition rate of one of the materials to be more in line with the deposition rate of a second one of the materials. Also, the deposition rates may be modified to be different from each other, to allow for a more selective deposition over the first one of the materials than over the second one of the materials.

20 Claims, 22 Drawing Sheets

(56) References Cited

U.S. PATENT DOCUMENTS

| | | | |
|---|---|---|---|
| 8,871,622 | B2 | 10/2014 | Bao |
| 9,190,489 | B1 | 11/2015 | Mountsier et al. |
| 9,299,775 | B2 * | 3/2016 | Bentley ................. H01L 21/308 |
| 9,530,868 | B2 * | 12/2016 | Huang ............... H10D 84/0158 |
| 10,867,789 | B2 | 12/2020 | Kao et al. |
| 2002/0048635 | A1 | 4/2002 | Kim et al. |
| 2003/0049942 | A1 | 3/2003 | Haukka et al. |
| 2003/0073308 | A1 | 4/2003 | Mercaldi |
| 2007/0098894 | A1 | 5/2007 | Verghese et al. |
| 2009/0075439 | A1 | 3/2009 | Furukawa et al. |
| 2011/0256726 | A1 | 10/2011 | LaVoie et al. |
| 2013/0137251 | A1 | 5/2013 | Liou et al. |
| 2014/0191330 | A1 | 7/2014 | Cheng et al. |
| 2014/0199854 | A1 * | 7/2014 | Chen ................. H01L 21/02167 438/775 |
| 2014/0213037 | A1 | 7/2014 | LiCausi et al. |
| 2014/0264592 | A1 | 9/2014 | Oxland et al. |
| 2014/0273531 | A1 | 9/2014 | Niskanen et al. |
| 2015/0194524 | A1 | 7/2015 | Hu et al. |
| 2015/0329965 | A1 | 11/2015 | Gadgil et al. |
| 2016/0276148 | A1 | 9/2016 | Qian et al. |

FOREIGN PATENT DOCUMENTS

| | | | |
|---|---|---|---|
| TW | 472341 | B | 1/2002 |
| WO | 2014097280 | A1 | 6/2014 |

* cited by examiner

Si substrate

SiN substrate

TREATMENT TO CONTROL DEPOSITION RATE

PRIORITY CLAIM AND CROSS-REFERENCE

This application is a continuation of U.S. patent application Ser. No. 16/569,953, filed on Sep. 13, 2019, entitled "Treatment to Control Deposition Rate," which is a division of U.S. patent application Ser. No. 16/051,064, filed on Jul. 31, 2018, entitled "Treatment to Control Deposition Rate," now U.S. Pat. No. 10,867,789, issued on Dec. 15, 2020, which is a division of U.S. patent application Ser. No. 14/942,407, filed on Nov. 16, 2015, entitled "Treatment to Control Deposition Rate," now U.S. Pat. No. 10,388,515 issued on Aug. 20, 2019, which applications are hereby incorporated herein by reference in its entirety.

BACKGROUND

The semiconductor industry has experienced rapid growth due to continuous improvements in the integration density of a variety of electronic components such as transistors, diodes, resistors, capacitors, and the like onto a semiconductor substrate. For the most part, these improvements in integration density have come from repeated reductions in minimum feature sizes, which allow more components to be integrated into a given area of the semiconductor substrate.

However, as the demand for miniaturization, higher speeds, and greater bandwidths, as well as lower power consumption and latency, has grown, there has also grown a need for smaller and smaller tolerances for the materials and processes used to manufacture semiconductor devices. In particular, as the size of the transistors, diodes, resistors, capacitors, etc. have been reduced, the materials used to form these devices have also experienced a reduction in size. As such, techniques to better reduce and better control these materials are constantly being sought for further miniaturization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
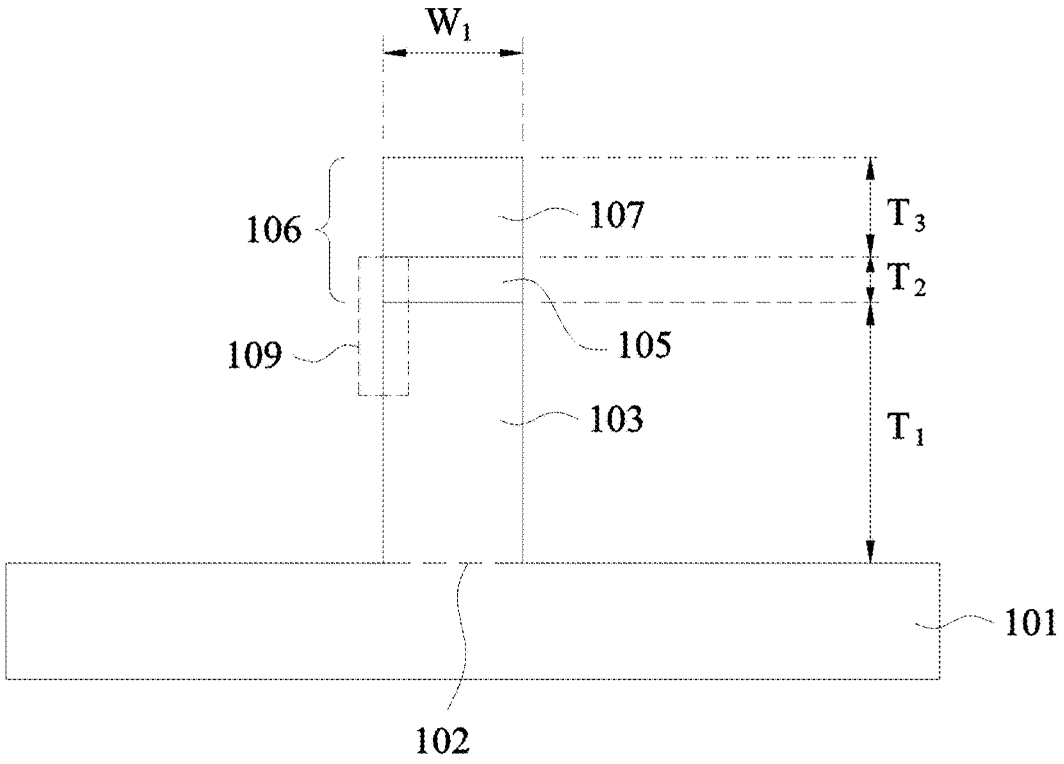
FIGS. 1A-1B illustrate a fin and a first masking layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
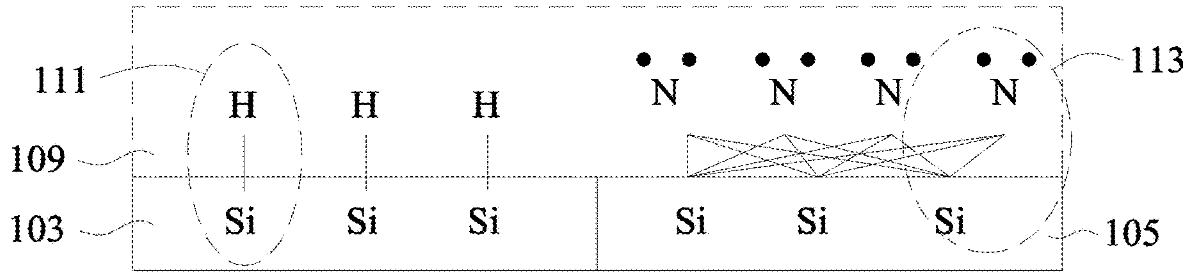

With reference now to FIGS. 1A-1B, there is illustrated a substrate 101 with a fin 103 (denoted as separate from the rest of the substrate 101 by dashed line 102), a first masking layer 105 over the fin 103, and a second masking layer 107. In an embodiment the substrate 101 may comprise, for example, bulk silicon, doped or undoped, germanium, a III-V material (such as gallium arsenide, indium arsenide, or the like), or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The fin 103 may be formed from the substrate 101. In an embodiment the fin 103 may be formed from the substrate 101 by initially forming the patterned mask 106 over the substrate 101. In an embodiment a patterned mask 106 may be a multi-layered structure that comprises the first masking layer 105 and the second masking layer 107 on top of the first masking layer 105. The first masking layer 105 may be a layer of dielectric material such as silicon nitride, although any other suitable material, such as $SiO_2$ or SiON may be utilized. The first masking layer 105 may be formed using a deposition process such as chemical vapor deposition (CVD), physical vapor deposition (PVD), or atomic layer deposition (ALD) or else may be formed by nitridizing an upper portion of the fin 103. The first masking layer 105 may have a second thickness $T_2$ of between about 5 nm and about 30 nm, such as about 10 nm.

Once the material for the first masking layer 105 has been formed over the substrate 101, the second masking layer 107 is formed over the first masking layer 105. In an embodiment the second masking layer 107 is a dielectric material such as silicon oxide, silicon oxynitride, or the like. The second masking layer 107 may be formed using a deposition process such as CVD, PVD, ALD, or the like to a third thickness $T_3$ of between about 10 nm and about 100 nm, such as about 40 nm. However, any suitable deposition process, such as a deposition of silicon followed by an oxidation process, and any suitable thickness may be used.

The materials of the patterned mask 106 (e.g., silicon nitride for the first masking layer 105 and silicon oxide for the second masking layer 107) are subsequently patterned using, for example, photolithography techniques. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask 106 to define the fin 103. As such, the patterned mask 106 may be formed to have a first width $W_1$ of between about 10 nm and about 100 nm, such as about 20 nm.

Once the patterned mask 106 has been formed, the fin 103 may be formed using a subtractive etching process along with the patterned mask 106. For example, exposed portions of the substrate 101 may be etched to form the fin 103 from the substrate 101. In an embodiment the substrate 101 may be etched by, for example, $HBr/O_2$, $HBr/Cl_2/O_2$, or $SF_6/Cl_2$ plasma. In an embodiment the fin 103 may be patterned such that it will eventually be used for a channel in a semiconductor device such as a fin field effect transistor (FinFET).

However, as one of ordinary skill in the art will recognize, the subtractive process described above to form the fin 103 is intended to be illustrative and is not intended to limit the embodiments. Rather, any suitable process, such as an epitaxial growth process using the substrate 101 and a mask, may alternatively be utilized to form the fin 103. Any suitable process for forming the fin 103 from the substrate 101 may be utilized, and all such processes are fully intended to be included within the scope of the embodiments.

FIG. 1B illustrates a close-up but not to scale view of a portion of the intersection between the fin 103 and the first masking layer 105 illustrated in the dashed box 109 in FIG. 1A. As can be seen, in an embodiment in which the fin 103 is silicon and the first masking layer 105 is silicon nitride, the fin 103 has first terminal groups (represented in FIG. 1B by the dashed circle labeled 111) that comprise bonds between silicon atoms and hydrogen atoms, while the first masking layer 105 has second terminal groups (represented in FIG. 1B by the dashed circle labeled 113) that are different from the first terminal groups 111 and which comprise bonds between silicon atoms and nitrogen atoms. These different terminal groups can cause an undesired difference in a subsequent deposition process, and can cause undesired differences in the thickness of a deposited material.

Figure 2:
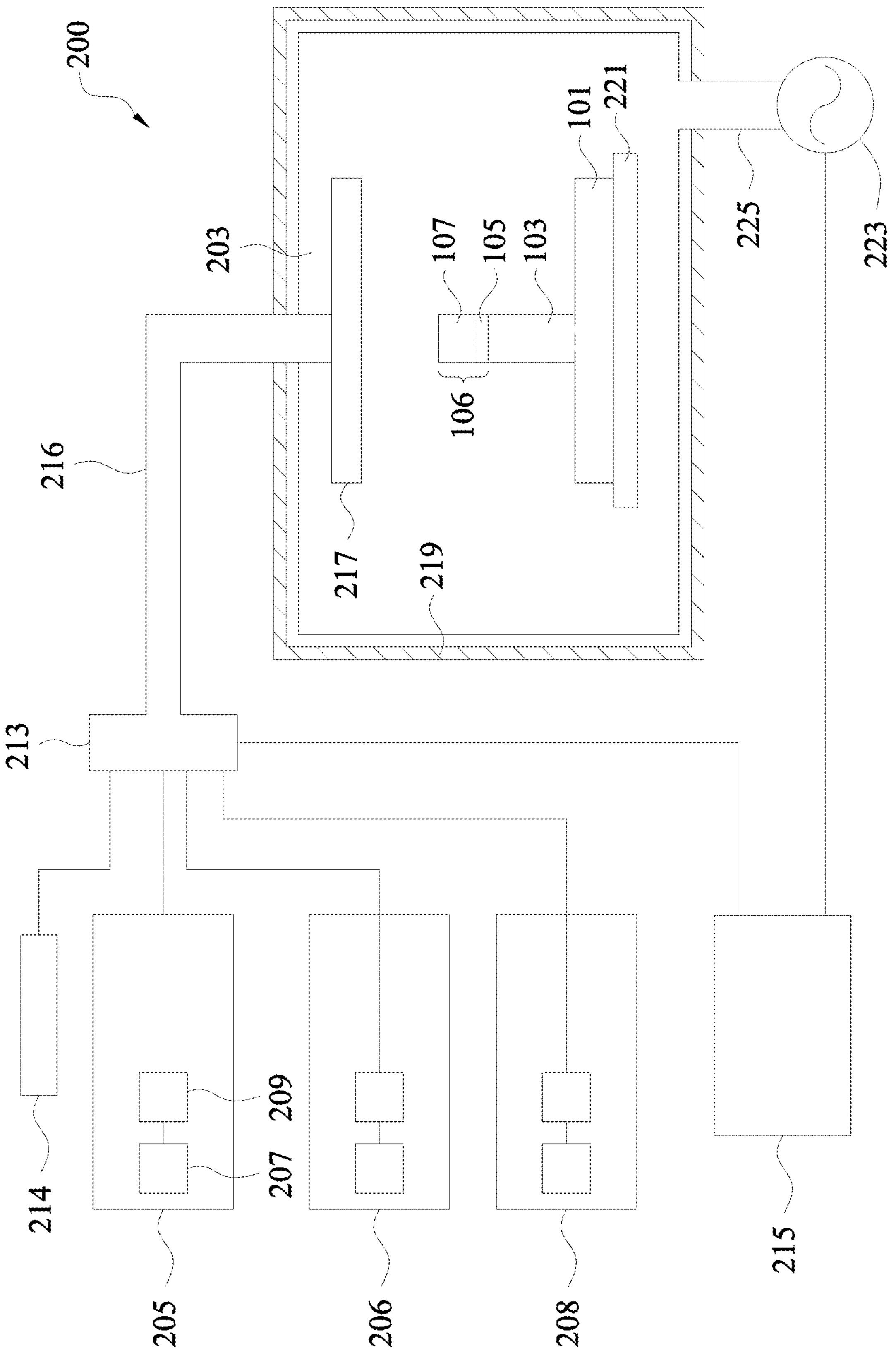
FIGS. 2-3 illustrate a treatment and deposition chamber in accordance with some embodiments.

FIG. 2 illustrates a treatment and deposition system 200 that may be utilized to receive precursor materials from a first precursor delivery system 205, a second precursor delivery system 206, and a third precursor delivery system 208, treat the fin 103 and/or the first masking layer 105, and to form layers of materials onto the substrate 101, the fin 103, and the first masking layer 105 after the substrate 101, the fin 103 and/or the first masking layer 105 have been treated. In an embodiment the first precursor delivery system 205, the second precursor delivery system 206, and the third precursor delivery system 208 may work in conjunction with one another to supply the various different precursor materials to a treatment and deposition chamber 203 wherein the substrate 101 (and consequently the fin 103 and the first masking layer 105) are placed. However, the first precursor delivery system 205, the second precursor delivery system 206, and the third precursor delivery system 208 may have physical components that are similar with each other.

For example, the first precursor delivery system 205, the second precursor delivery system 206, and the third precursor delivery system 208 may each include a gas supply 207 and a flow controller 209 (labeled in FIG. 2 with regards to the first precursor delivery system 205 but not labeled for clarity with respect to the second precursor delivery system 206 and the third precursor delivery system 208). In an embodiment in which the first treatment precursor is stored in a gaseous state, the gas supply 207 may supply the first treatment precursor to the treatment and deposition chamber 203. The gas supply 207 may be a vessel, such as a gas storage tank, that is located either locally to the treatment and deposition chamber 203 or else may be located remotely from the treatment and deposition chamber 203. Alternatively, the gas supply 207 may be a facility that independently prepares and delivers the first treatment precursor to the flow controller 209. Any suitable source for the first treatment precursor may be utilized as the gas supply 207, and all such sources are fully intended to be included within the scope of the embodiments.

The gas supply 207 may supply the desired precursor to the flow controller 209. The flow controller 209 may be utilized to control the flow of the precursor to the precursor gas controller 213 and, eventually, to the treatment and deposition chamber 203, thereby also helping to control the pressure within the treatment and deposition chamber 203. The flow controller 209 may be, e.g., a proportional valve, a modulating valve, a needle valve, a pressure regulator, a mass flow controller, combinations of these, or the like. However, any suitable method for controlling and regulating the flow of the carrier gas to the precursor canister 211 may be utilized, and all such components and methods are fully intended to be included within the scope of the embodiments.

However, as one of ordinary skill in the art will recognize, while the first precursor delivery system 205, the second precursor delivery system 206, and the third precursor delivery system 208 have been described herein as having identical components, this is merely an illustrative example and is not intended to limit the embodiments in any fashion. Any type of suitable precursor delivery system, with any type and number of individual components identical to or different from any of the other precursor delivery systems within the treatment and deposition system 200, may alternatively be utilized. All such precursor systems are fully intended to be included within the scope of the embodiments.

Additionally, in an embodiment in which the first treatment precursor is stored in a solid or liquid state, the gas supply 207 may store a carrier gas and the carrier gas may be introduced into a precursor canister (not separately illustrated), which stores the first treatment precursor in the solid or liquid state. The carrier gas is then used to push and carry the first treatment precursor as it either evaporates or sublimates into a gaseous section of the precursor canister before being sent to the precursor gas controller 213. Any suitable method and combination of units may be utilized to provide the first treatment precursor, and all such combination of units are fully intended to be included within the scope of the embodiments.

The first precursor delivery system 205, the second precursor delivery system 206, and the third precursor delivery system 208 may supply their individual precursor materials into a precursor gas controller 213. The precursor gas controller 213 connects and isolates the first precursor delivery system 205, the second precursor delivery system 206, and the third precursor delivery system 208 from the treatment and deposition chamber 203 in order to deliver the desired precursor materials to the treatment and deposition chamber 203. The precursor gas controller 213 may include such devices as valves, flow meters, sensors, and the like to control the delivery rates of each of the precursors, and may be controlled by instructions received from the control unit 215 (described further below with respect to FIG. 3).

The precursor gas controller 213, upon receiving instructions from the control unit 215, may open and close valves so as to connect one of the first precursor delivery system 205, the second precursor delivery system 206, and the third precursor delivery system 208 to the treatment and deposition chamber 203 and direct a desired precursor material through a manifold 216, into the treatment and deposition chamber 203, and to a showerhead 217. The showerhead 217 may be utilized to disperse the chosen precursor material into the treatment and deposition chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor material into the treatment and deposition chamber 203.

However, as one of ordinary skill in the art will recognize, the introduction of precursor materials to the treatment and deposition chamber 203 through a single showerhead 217 or through a single point of introduction as described above is intended to be illustrative only and is not intended to be limiting to the embodiments. Any number of separate and independent showerheads 217 or other openings to introduce precursor materials into the treatment and deposition chamber 203 may alternatively be utilized. All such combinations of showerheads and other points of introduction are fully intended to be included within the scope of the embodiments.

The treatment and deposition chamber 203 may receive the desired precursor materials and expose the precursor materials to the substrate 101, the fin 103, and the first masking layer 105, and the treatment and deposition chamber 203 may be any desired shape that may be suitable for dispersing the precursor materials and contacting the precursor materials with the substrate 101, the fin 103, and the first masking layer 105. In the embodiment illustrated in FIG. 2, the treatment and deposition chamber 203 has a cylindrical sidewall and a bottom. However, the treatment and deposition chamber 203 is not limited to a cylindrical shape, and any other suitable shape, such as a hollow square tube, an octagonal shape, or the like, may be utilized. Furthermore, the treatment and deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the treatment and deposition chamber 203 the substrate 101 may be placed on a mounting platform 221 in order to position and control the substrate 101 and the fin 103 during the treatment and deposition processes. The mounting platform 221 may include heating mechanisms in order to heat the substrate 101 during the treatment and deposition processes. Furthermore, while a single mounting platform 221 is illustrated in FIG. 2, any number of mounting platforms 221 may additionally be included within the treatment and deposition chamber 203.

Additionally, the treatment and deposition chamber 203 and the mounting platform 221 may be part of a cluster tool system (not shown). The cluster tool system may be used in conjunction with an automated handling system in order to position and place the substrate 101 into the treatment and deposition chamber 203 prior to the treatment and deposition processes, position, hold the substrate 101 during the treatment and deposition processes, and remove the substrate 101 from the treatment and deposition chamber 203 after the treatment and deposition processes.

The treatment and deposition chamber 203 may also have an exhaust outlet 225 for exhaust gases to exit the treatment and deposition chamber 203. A vacuum pump 223 may be connected to the exhaust outlet 225 of the treatment and deposition chamber 203 in order to help evacuate the exhaust gases. The vacuum pump 223, under control of the control unit 215, may also be utilized to reduce and control the pressure within the treatment and deposition chamber 203 to a desired pressure and may also be utilized to evacuate precursor materials from the treatment and deposition chamber 203 in preparation for the introduction of the next precursor material.

Figure 3:
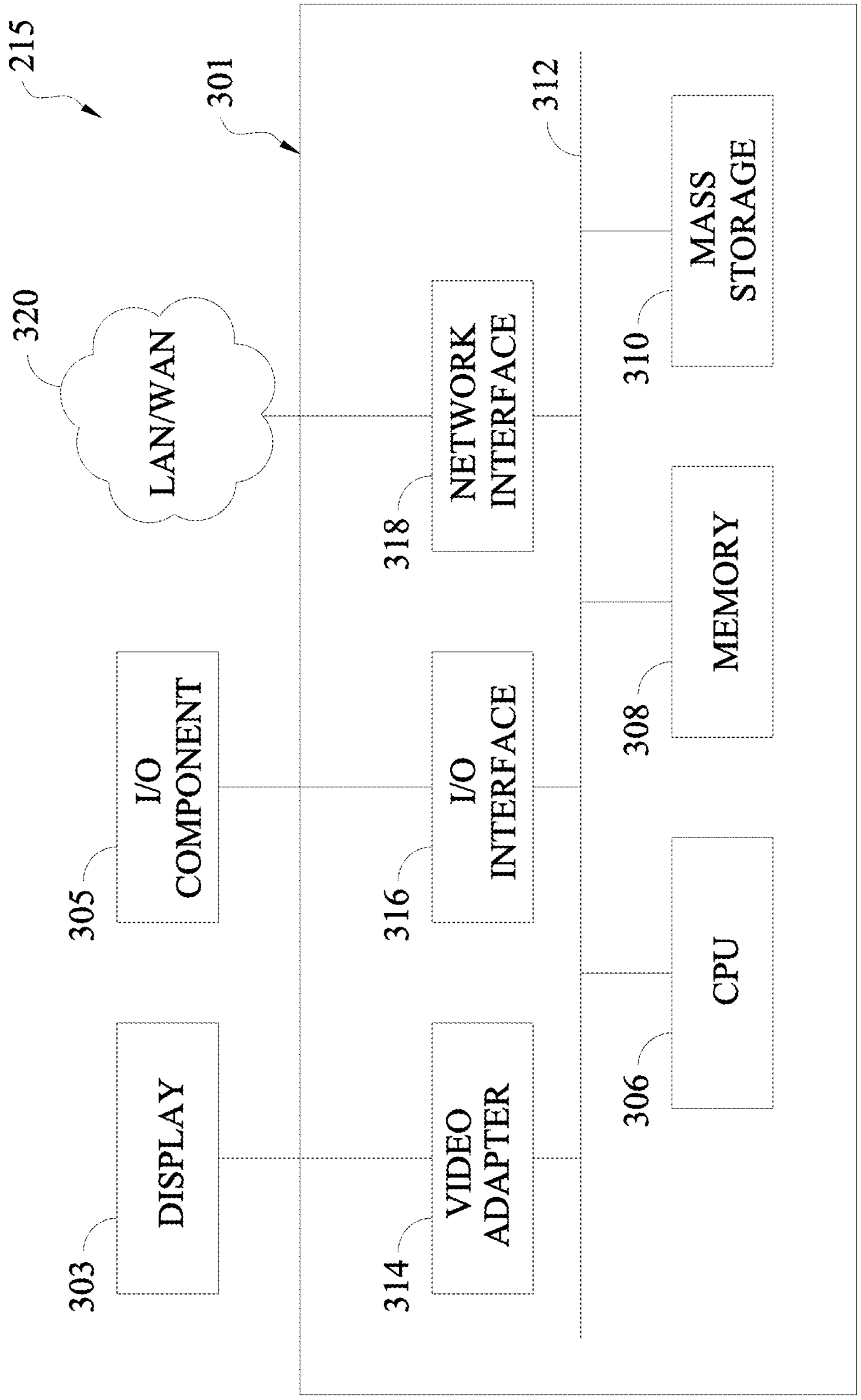

FIG. 3 illustrates an embodiment of the control unit 215 that may be utilized to control the precursor gas controller 213 and the vacuum pump 223 (as illustrated in FIG. 2). The control unit 215 may be any form of computer processor that can be used in an industrial setting for controlling process machines. In an embodiment the control unit 215 may comprise a processing unit 201, such as a desktop computer, a workstation, a laptop computer, or a dedicated unit customized for a particular application. The control unit 215 may be equipped with a display 303 and one or more input/output components 305, such as instruction outputs, sensor inputs, a mouse, a keyboard, printer, combinations of these, or the like. The processing unit 301 may include a central processing unit (CPU) 306, memory 308, a mass storage device 310, a video adapter 314, and an I/O interface 316 connected to a bus 312.

The bus 312 may be one or more of any type of several bus architectures including a memory bus or memory controller, a peripheral bus, or video bus. The CPU 306 may comprise any type of electronic data processor, and the memory 308 may comprise any type of system memory, such as static random access memory (SRAM), dynamic random access memory (DRAM), or read-only memory (ROM). The mass storage device 310 may comprise any type of storage device configured to store data, programs, and other information and to make the data, programs, and other information accessible via the bus 312. The mass storage device 310 may comprise, for example, one or more of a hard disk drive, a magnetic disk drive, or an optical disk drive.

The video adapter 314 and the I/O interface 316 provide interfaces to couple external input and output devices to the processing unit 301. As illustrated in FIG. 3, examples of input and output devices include the display 303 coupled to the video adapter 314 and the I/O component 305, such as a mouse, keyboard, printer, and the like, coupled to the I/O interface 316. Other devices may be coupled to the processing unit 301, and additional or fewer interface cards may be utilized. For example, a serial interface card (not shown) may be used to provide a serial interface for a printer. The processing unit 301 also may include a network interface 318 that may be a wired link to a local area network (LAN) or a wide area network (WAN) 320 and/or a wireless link.

It should be noted that the control unit 215 may include other components. For example, the control unit 215 may include power supplies, cables, a motherboard, removable storage media, cases, and the like. These other components, although not shown in FIG. 3, are considered part of the control unit 215.

Figure 4A:
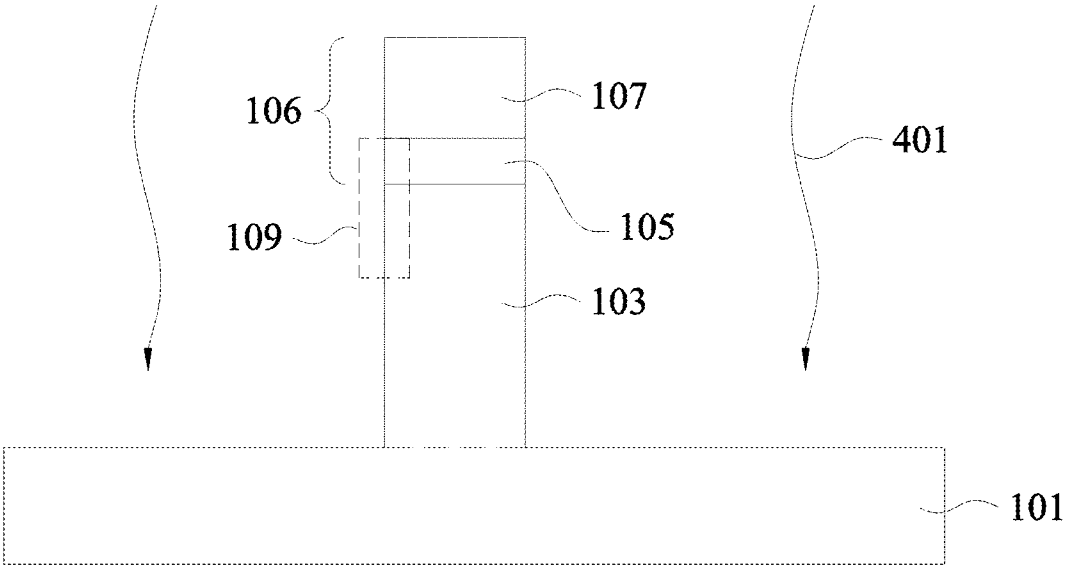
FIGS. 4A-4C illustrate a first treatment process in accordance with some embodiments.
Figure 4B:
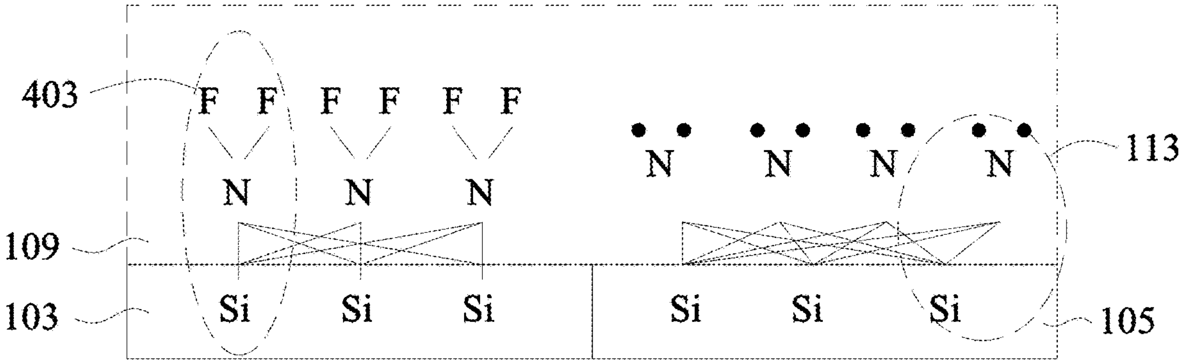

FIGS. 4A-4B illustrate a first treatment (represented in FIG. 4A by the wavy lines labeled 401) of the fin 103 and the substrate 101 in preparation for a deposition of a first dielectric layer 501 (not illustrated in FIGS. 4A-4B but illustrated and described further below with respect to FIGS. 6A-6B) onto the substrate 101 and also onto the fin 103, the first masking layer 105, and the second masking layer 107. In an embodiment the first treatment 401 may be performed within the treatment and deposition chamber 203 (although it may also be performed in a separate chamber than the chamber used to deposit the first dielectric layer 501) and may be initiated by placing a first treatment precursor chemical within the third precursor delivery system 208. The first treatment precursor chemical may be a chemical that will react with the material of the substrate 101 and the fin 103 (e.g. silicon) and modify the first terminal groups 111 of the substrate 101 and the fin 103 to be the same as the second terminal groups 113 on the first masking layer 105. In an embodiment in which the fin 103 and the substrate 101 are silicon and the masking layer is silicon nitride, the first treatment precursor chemical may be $NF_3$, although any other suitable chemical, such as $NH_3$ or $N_2O$, may also be used either by itself or in combination.

Once the first treatment precursor chemical has been placed into the third precursor delivery system 208, the first treatment 401 may be initiated by the control unit 215 sending an instruction to the precursor gas controller 213 to connect the third precursor delivery system 208 to the treatment and deposition chamber 203. Once connected, the third precursor delivery system 208 can deliver the first treatment precursor chemical (e.g., the $NF_3$) to the showerhead 217 through the precursor gas controller 213 and the manifold 216. The showerhead 217 can then disperse the first treatment precursor chemical into the treatment and deposition chamber 203, wherein the first treatment precursor chemical can react to the exposed surfaces of the substrate 101 and the fin 103.

In the embodiment to treat the substrate 101 and the fin 103 made of silicon with $NF_3$, the first treatment precursor chemical may be flowed into the treatment and deposition chamber 203 at a flow rate of between about 1 slm and about 5 slm for about 24 seconds. Additionally, the treatment and deposition chamber 203 may be held at a pressure of between about 1 mtorr and about 5 mtorr, such as about 2 mtorr, and a temperature of between about 200° C. and about 300° C., such as about 250° C. However, as one of ordinary skill in the art will recognize, these process conditions are only intended to be illustrative, as any suitable process conditions may be utilized while remaining within the scope of the embodiments.

Looking at FIG. 4B (which illustrates a close-up but still not to scale view of the dashed box 109 in FIG. 4A), the first treatment precursor chemical of the first treatment 401 will react with the exposed first terminal groups 111 of the fin 103 and the substrate 101 without significantly reacting with the second terminal groups 113 of the first masking layer 105. In particular, in an embodiment in which $NF_3$ is utilized as the first treatment precursor chemical, the $NF_3$ will react with the silicon portion of the fin 103, breaking the bonds within the first terminal groups 111 between the silicon and the hydrogen and removing the terminal hydrogen atom. Once the terminal hydrogen atom has been removed, the now open terminal site at the surface of the fin 103 will bond with the nitrogen atoms to form a third terminal group (represented in FIG. 4B by the dashed circle labeled 403) that comprises, e.g., a $SiNF_2$ compound.

Figure 4C:
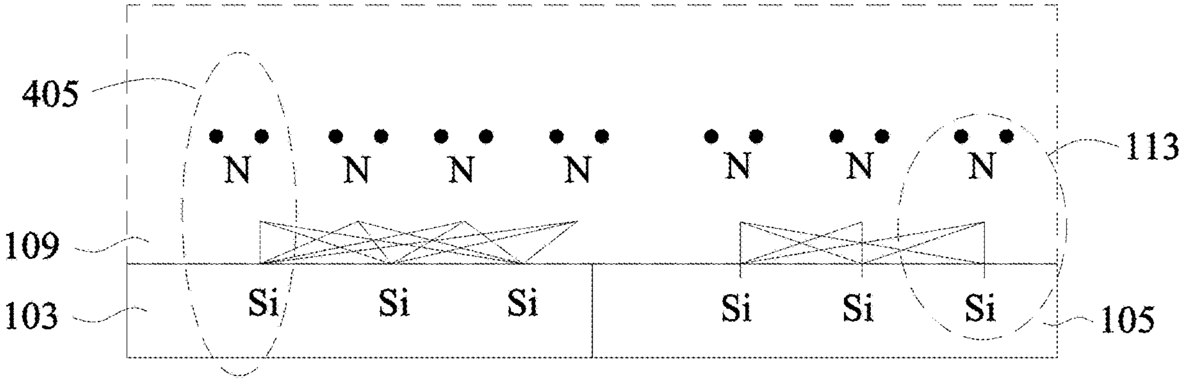

FIG. 4C illustrates the next step in the reaction mechanism of the embodiment wherein the fin 103 is silicon and is treated with $NF_3$. In this step the two fluorine atoms disassociate from the nitrogen atom bonded to the silicon. In an embodiment the fluorine atoms will disassociate spontaneously as part of the reactions that occur during the first treatment 401, and will leave behind an open nitrogen atom as part of a fourth terminal group (represented in FIG. 4C by the dashed circle labeled 405) on the silicon of the fin 103.

However, by modifying the first terminal groups 111 (e.g., silicon bonded to hydrogen) at the surface of the fin 103 into the fourth terminal groups 405 (e.g., silicon bonded to nitrogen), the surface of the fin 103 now has terminal groups that are the same as or similar to the first masking layer 105. As such, during the subsequent deposition process (described further below with respect to FIG. 5), both the fin 103 and the first masking layer 105 have similar terminal groups and will react in a similar fashion.

Figure 5A:
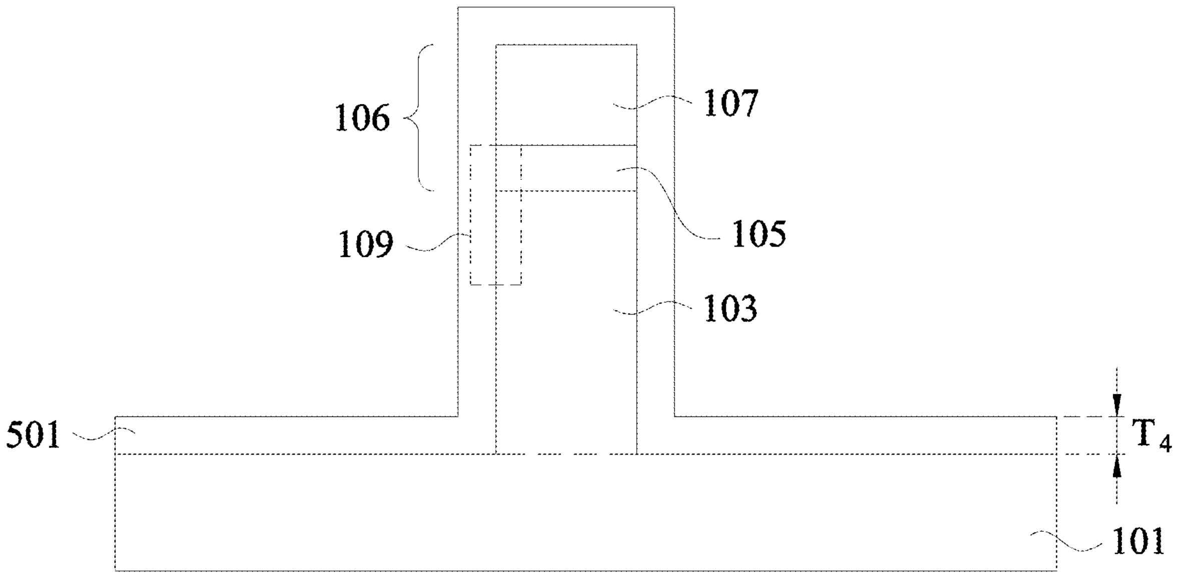
FIGS. 5A-5D illustrate a deposition of a dielectric layer in accordance with some embodiments.

FIG. 5*a* illustrates a deposition of the first dielectric layer 501 over the fin 103, the first masking layer 105, and the second masking layer 107. In an embodiment the same treatment and deposition system 200 may be utilized to deposit the first dielectric layer 501 onto the fin 103, the first masking layer 105, and the second masking layer 107. In an embodiment the first dielectric layer 501 may be a dielectric layer of a material such as silicon nitride. The first dielectric layer 501 may be formed in the treatment and deposition chamber 203 utilizing a deposition process such as atomic layer deposition (ALD). However, this material and this process are intended to be illustrative and are not intended to be limiting, as other desirable materials, such as other dielectric materials, and other suitable deposition processes, may alternatively be utilized.

In an embodiment the formation of the first dielectric layer 501 may be initiated by putting a first precursor material into the first precursor delivery system 205. For example, in an embodiment in which the first dielectric layer 501 is silicon nitride, the first precursor material may be a precursor such as dichlorosilane and may be placed into the first precursor delivery system 205. However, as one of ordinary skill in the art will recognize, this precursor is not the only precursor that may be utilized to form a layer of silicon nitride, and the use of dichlorosilane is not intended to be limiting to the embodiments. Any suitable precursor material in any suitable phase (solid, liquid, or gas) to form a layer of silicon nitride, such as monochlorosilane, or any other precursor that may be used to form alternative layers, may be utilized.

Additionally, a second precursor material may be placed into the second precursor delivery system 206. In the embodiment in which a layer of silicon nitride is the desired material for the first dielectric layer 501, the second precursor material may be a precursor material that may contain nitrogen in order to react with the first precursor material to form a monolayer of silicon nitride. For example, in the embodiment in which dichlorosilane is utilized as the first precursor material, ammonia ($NH_3$) may be used as the second precursor material and may be placed into the second precursor delivery system 206. However, the description of ammonia as the second precursor material is not intended to be limiting to the embodiments, and any other suitable precursor material, such as $N_2$, combinations of these, or the like, may alternatively be utilized as the second precursor material.

Once the first precursor material and the second precursor material have been placed into the first precursor delivery system 205 and the second precursor delivery system 206, respectively, the formation of the first dielectric layer 501 may be initiated by the control unit 215 sending an instruction to the precursor gas controller 213 to connect the first precursor delivery system 205 to the treatment and deposition chamber 203. Once connected, the first precursor delivery system 205 can deliver the first precursor material (e.g., the dichlorosilane) to the showerhead 217 through the precursor gas controller 213 and the manifold 216. The showerhead 217 can then disperse the first precursor material into the treatment and deposition chamber 203, wherein the first precursor material can be adsorbed and react to the exposed surfaces of the substrate 101, the fin 103, the first masking layer 105, and the second masking layer 107.

In the embodiment to form a layer of silicon nitride, the first precursor material may be flowed into the treatment and deposition chamber 203 at a flow rate of between about 1 slm and about 5 slm for about 50 second per cycle. Additionally, the treatment and deposition chamber 203 may be held at a pressure of between about 3 torr and about 5 torr, such as about 4 torr, and a temperature of between about 450° C. and about 700° C., such as about 550° C. However, as one of ordinary skill in the art will recognize, these process conditions are only intended to be illustrative, as any suitable process conditions may be utilized while remaining within the scope of the embodiments.

As the first precursor material is adsorbed onto the substrate 101, the fin 103, the first masking layer 105, and the second masking layer 107, the first precursor material will react with open active sites located on the exposed surfaces of the substrate 101, the fin 103, the first masking layer 105, and the second masking layer 107. However, once all of the open active sites on the substrate 101, the fin 103, the first masking layer 105, and the second masking layer 107 have reacted with the first precursor material, the reaction will stop, as there are no more open active sites to which the first precursor material will bond. This limitation causes the reaction of the first precursor material with the substrate 101, the fin 103, the first masking layer 105, and the second masking layer 107 to be self-limiting and to form a monolayer of the reacted first precursor material on the surface of the fin 103, thereby allowing for a more precise control of the thickness of the first dielectric layer 501.

Figure 5B:
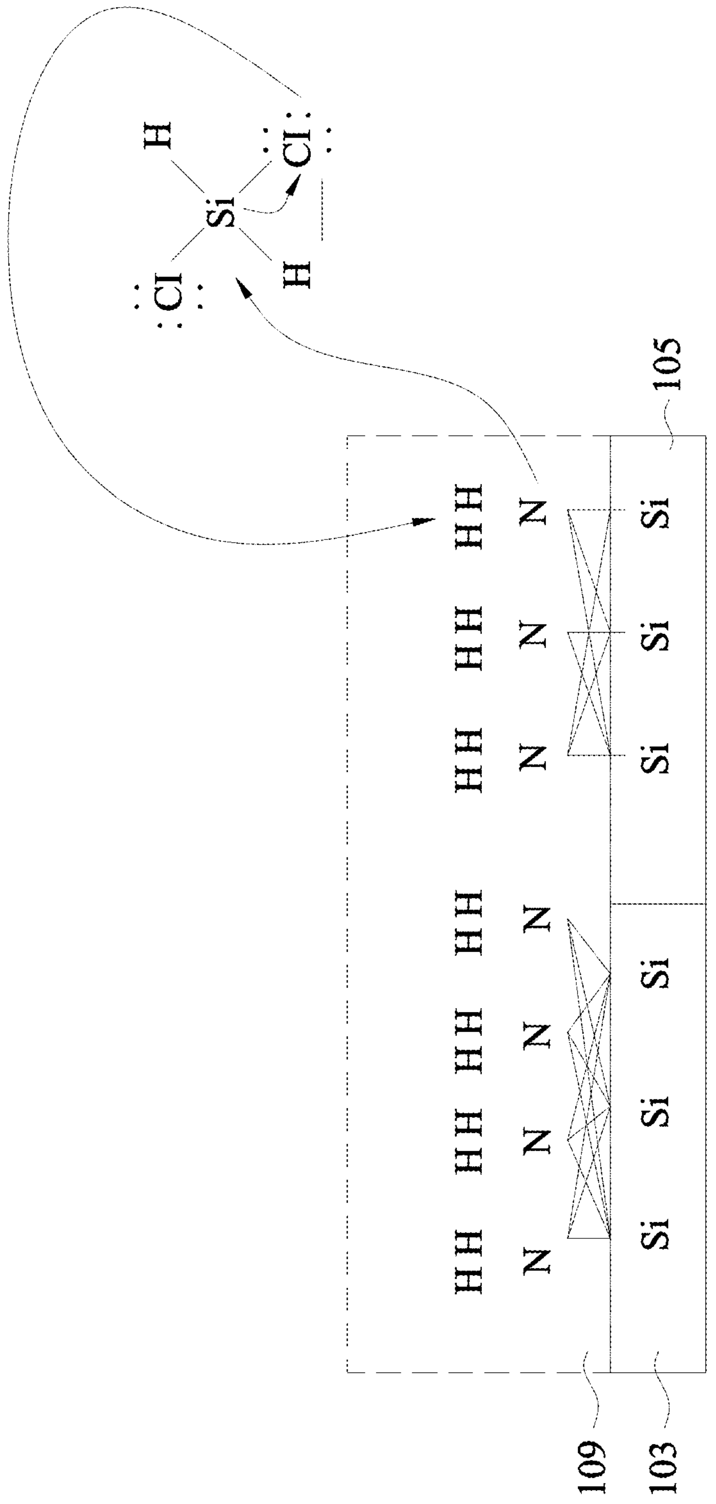

FIG. 5B illustrates a particular embodiment in which the first precursor material is dichlorosilane which has two hydrogen atoms and two chlorine atoms all bonded to the same silicon atom. In this embodiment one of the chlorine atoms will react with one of the hydrogen atoms (that has bonded to the open nitrogen sites present in FIG. 4C) and the nitrogen will bond with the silicon atom within the dichlorosilane. As such, the silicon atom is bonded to the nitrogen atom.

After the self-limiting reaction on the fin 103 has finished, the treatment and deposition chamber 203 may be purged of the first precursor material. For example, the control unit 215 may instruct the precursor gas controller 213 to disconnect the first precursor delivery system 205 (containing the first precursor material to be purged from the treatment and deposition chamber 203) and to connect a purge gas delivery system 214 to deliver a purge gas to the treatment and deposition chamber 203. In an embodiment the purge gas delivery system 214 may be a gaseous tank or other facility that provides a purge gas such as nitrogen, argon, xenon, or other non-reactive gas to the treatment and deposition chamber 203. Additionally, the control unit 215 may also initiate the vacuum pump 223 in order to apply a pressure differential to the treatment and deposition chamber 203 to aid in the removal of the first precursor material. The purge gas, along with the vacuum pump 223, may purge the first precursor material from the treatment and deposition chamber 203 for about 3 seconds.

After the purge of the first precursor material has been completed, the introduction of the second precursor material (e.g., ammonia) to the treatment and deposition chamber 203 may be initiated by the control unit 215 sending an instruction to the precursor gas controller 213 to disconnect the purge gas delivery system 214 and to connect the second precursor delivery system 206 (containing the second precursor material) to the treatment and deposition chamber 203. Once connected, the second precursor delivery system 206 can deliver the second precursor material to the showerhead 217. The showerhead 217 can then disperse the second precursor material into the treatment and deposition chamber 203, wherein the second precursor material can be adsorbed on the surfaces of the substrate 101, the fin 103, the first masking layer 105, and the second masking layer 107 and react with the first precursor material in another self-limiting reaction to form a monolayer of the desired material, e.g., silicon nitride, on the surface of the substrate 101, the fin 103, the first masking layer 105, and the second masking layer 107.

In the embodiment discussed above to form a layer of silicon nitride with dichlorosilane, the ammonia may be introduced into the treatment and deposition chamber 203 at a flow rate of between about 2 slm and about 10 slm, such as about 5 slm, for about 30 seconds. Additionally, the treatment and deposition chamber 203 may be held at a pressure of about 0 torr and a temperature of between about 450° C. and about 700° C. However, as one of ordinary skill in the art will recognize, these process conditions are only intended to be illustrative, as any suitable process conditions may be utilized to introduce oxygen while remaining within the scope of the embodiments.

After the monolayer of the desired material, e.g., silicon nitride, has been formed, the treatment and deposition chamber 203 may be purged (leaving behind the monolayer of the desired material on the substrate 101, the fin 103, the first masking layer 105, and the second masking layer 107) using, e.g., a purge gas from the purge gas delivery system 214 for about three seconds. After the treatment and deposition chamber 203 has been purged, a first cycle for the formation of the desired material has been completed, and a second cycle similar to the first cycle may be started. For example, the repeated cycle may introduce the first precursor material, purge with the purge gas, pulse with the second precursor, and purge with the purge gas. These cycles may be repeated until the first dielectric layer 501 on the fin 103 has a fourth thickness $T_4$ of between about 40 Å and about 60 Å, such as about 50 Å. Once the desired thickness of the first dielectric layer 501 has been reached, the substrate 101 may be removed from the treatment and deposition chamber 203 for further processing.

However, as one of ordinary skill in the art will recognize, the above described process to form the first dielectric layer 501 is intended to be illustrative and is not intended to be limiting to the embodiments. Any other suitable process, such as initially pulsing the second precursor material (e.g., ammonia), purging with the purge gas, introducing the first precursor material (e.g., dichlorosilane), and purging with the purge gas to complete a first cycle and then repeating the first cycle, may alternatively be utilized. This and any other suitable process to form the first dielectric layer 501 are fully intended to be included within the scope of the embodiments.

However, by using the first treatment 401 prior to the deposition of the first dielectric layer 501, the terminal groups at the surface of both the fin 103 (e.g., the fourth terminal groups 405) and the terminal groups at the surface of the first masking layer 105 (e.g., the second terminal groups 113) will be almost the same (as illustrated in FIG. 4C at the end of the first treatment 401) instead of being different (as illustrated in FIG. 1B prior to the first treatment 401). As such, similar reactions will occur at a similar reaction rate on both the fin 103 and the first masking layer 105, and any differences that may occur because of the different reactions or reaction rates may be reduced or eliminated. As such, the thickness of the first dielectric layer 501 may be constant as the first dielectric layer 501 transfers from over the fin 103 to over the first masking layer 105, and a more uniform deposition may be obtained.

Figure 5C:
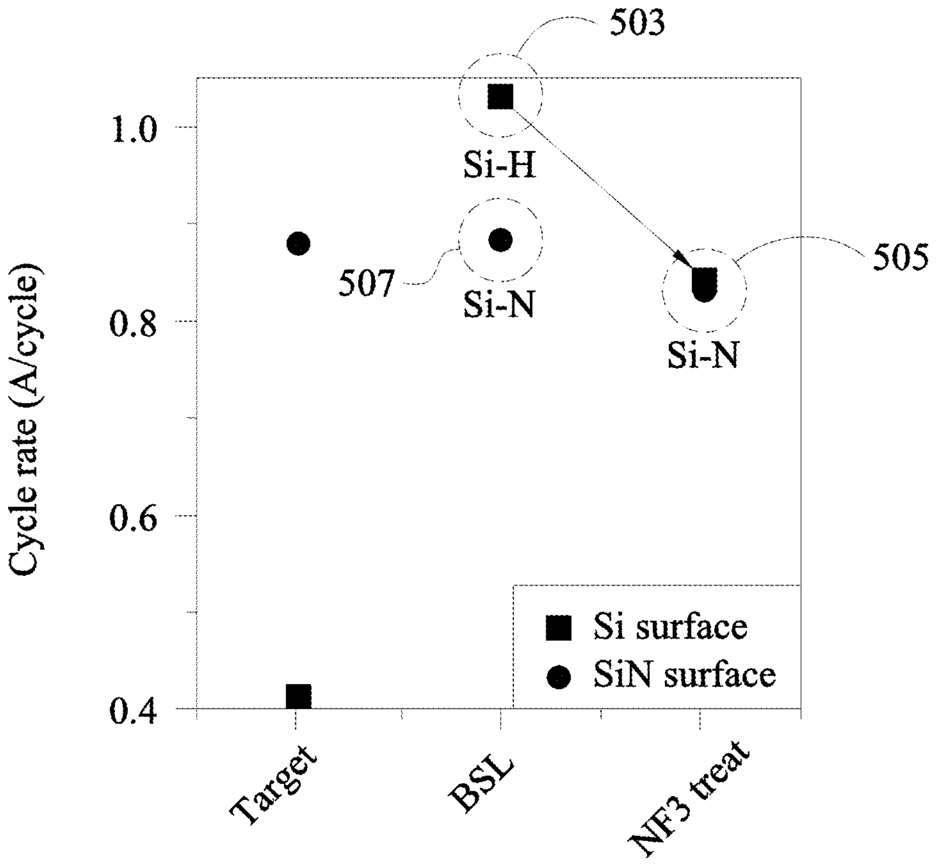

FIG. 5C illustrates this effect. In particular, the original first terminal groups 111 that terminate the material of the fin 103 (e.g., the silicon-hydrogen bonds illustrated by the dashed circle 503 on the baseline (BSL)) will have a cycle growth rate (in Å/cycle) of over 1.0 Å/cycle. However, by performing the first treatment 401, the first terminal groups 111 may be modified to the fourth terminal groups 405 (e.g., the silicon-nitrogen bonds illustrated by the dashed circle 505), which have a similar cycle growth rate as the second terminal groups 113 (e.g., the silicon-nitrogen bonds illustrated by the dashed circle labeled 507) that terminate the material of the first masking layer 105 (e.g., silicon nitride). As such, a more consistent growth rate may be obtained, and a more consistent thickness may be obtained when depositing the first dielectric layer 501 over separate materials.

Figure 5D:
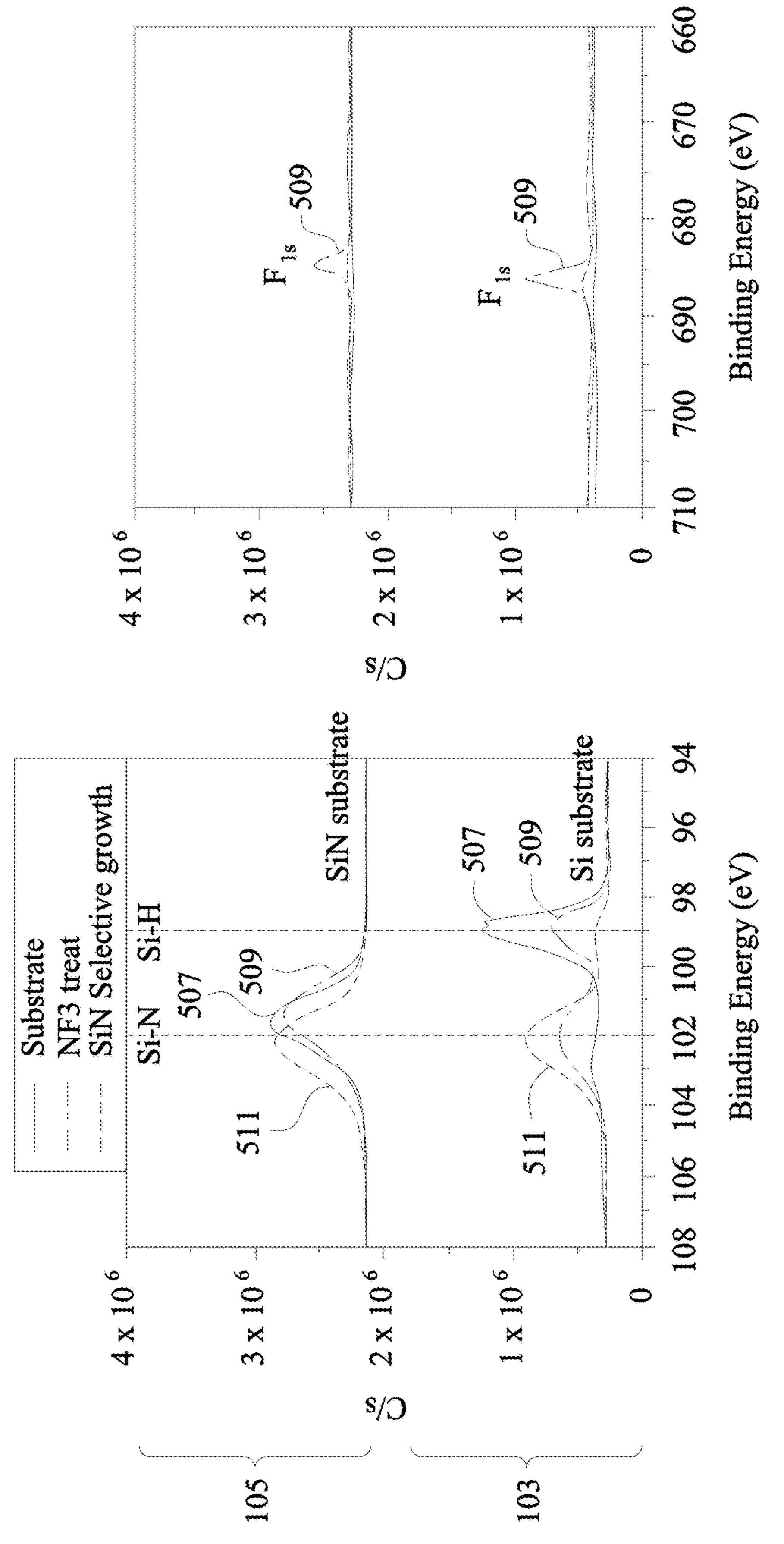

Additional data is presented in FIG. 5D, which illustrates XPS data taken before the first treatment 401 (represented in FIG. 5D by the lines labeled 507), after the first treatment 401 (represented in FIG. 5D by the lines labeled 509), and after the deposition of the first dielectric layer 501 (represented in FIG. 5D by the line labeled 511) for both the fin 103 (e.g., silicon substrate) and the first masking layer 105 (e.g., silicon nitride substrate). As can be seen, prior to the first treatment 401, the fin 103 has mostly silicon-hydrogen bonds and almost no silicon-nitrogen bonds or fluorine while the first masking layer 105 has primarily silicon-nitrogen bonds. However, after the first treatment 401, the fin 103 has a combination of silicon-nitrogen bonds as well as silicon-fluorine bonds while the first masking layer 105 still has primarily silicon-nitrogen bonds, although there is a measurable presence of fluorine. Finally, after the deposition of the first dielectric layer 501, the fin 103 has primarily silicon-nitrogen bonds while the first masking layer 107 still has primarily the silicon-nitrogen bonds.

Figure 6A:
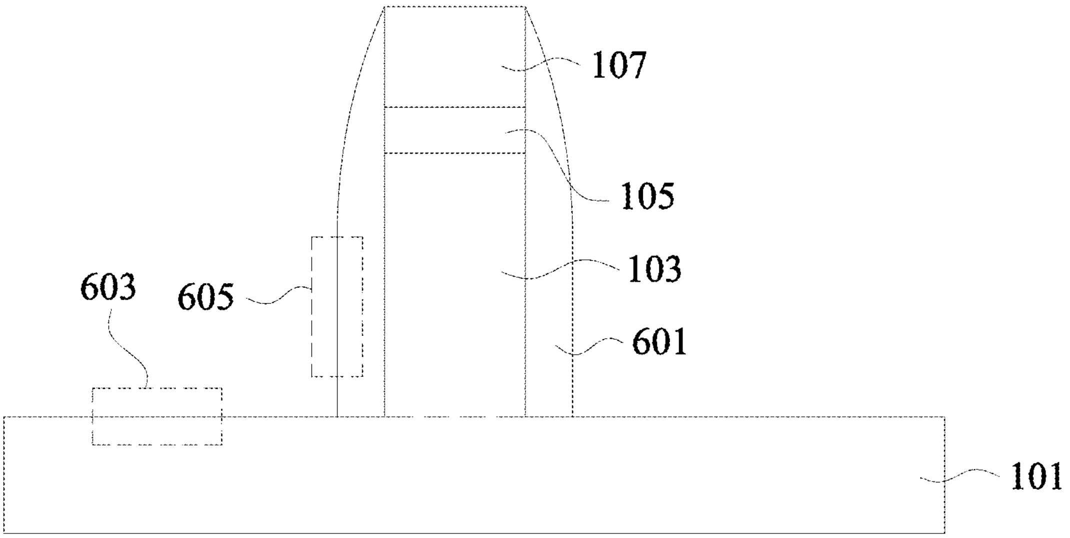
FIGS. 6A-6C illustrate a formation of spacers in accordance with some embodiments.
Figure 6B:
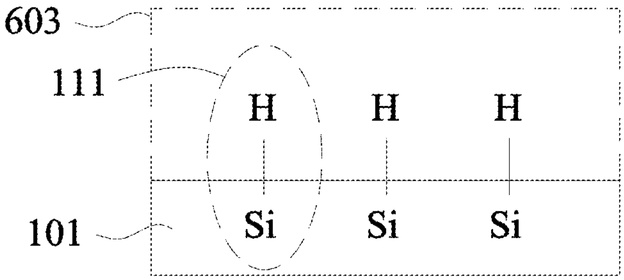
Figure 6C:
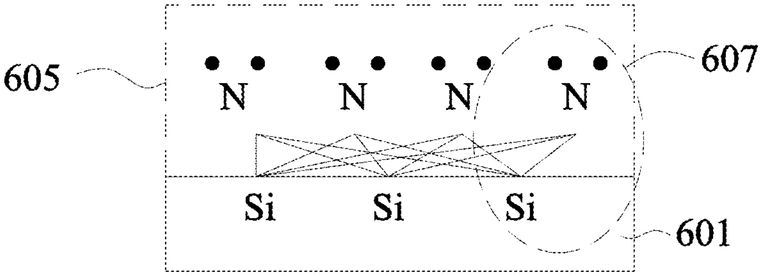

FIGS. 6A-6C illustrate another embodiment in which a second treatment 701 (not illustrated in FIGS. 6A-6C but illustrated and described below with respect to FIGS. 7A-7C) may be utilized to modify the growth rate of the first dielectric layer 501 over differing materials, with FIG. 6B illustrating a surface of the substrate 101 within the dashed box 603 in FIG. 6A and with FIG. 6C illustrating a surface of spacers 601 within the dashed box 605 in FIG. 6A. In this embodiment, the first treatment is not performed and, prior to the second treatment 701 being performed, the spacers 601 may be formed adjacent to the fin 103, the first masking layer 105, and the second masking layer 107. The spacers 601 may be formed on opposing sides of the fin 103, and may be formed by blanket depositing a spacer layer (not separately illustrated) on the previously formed structure. The spacer layer may comprise SiN, SiCN, SiOCN, and the like and may be formed by methods utilized to form such a layer, such as chemical vapor deposition (CVD), plasma enhanced CVD, sputter, and other methods known in the art. The spacers 601 may then be patterned, such as by one or more etches to remove the spacer layer from the horizontal surfaces of the structure.

In this embodiment the surface of the substrate 101 may be exposed for the subsequent deposition of the first dielectric layer 501, and may comprise different terminal groups from the spacers 601. For example, as illustrated in FIG. 6B, in an embodiment in which the substrate 101 is silicon, the substrate 101 may have the first terminal groups 111 wherein silicon atoms are bonded to hydrogen atoms. However, as illustrated in FIG. 6C, in an embodiment in which the spacers 601 comprise silicon nitride, the spacers 601 may have exposed surfaces with fifth terminal groups (represented in FIG. 6C by the dashed circle labeled 607) that comprise silicon bonded with nitrogen.

Figure 7A:
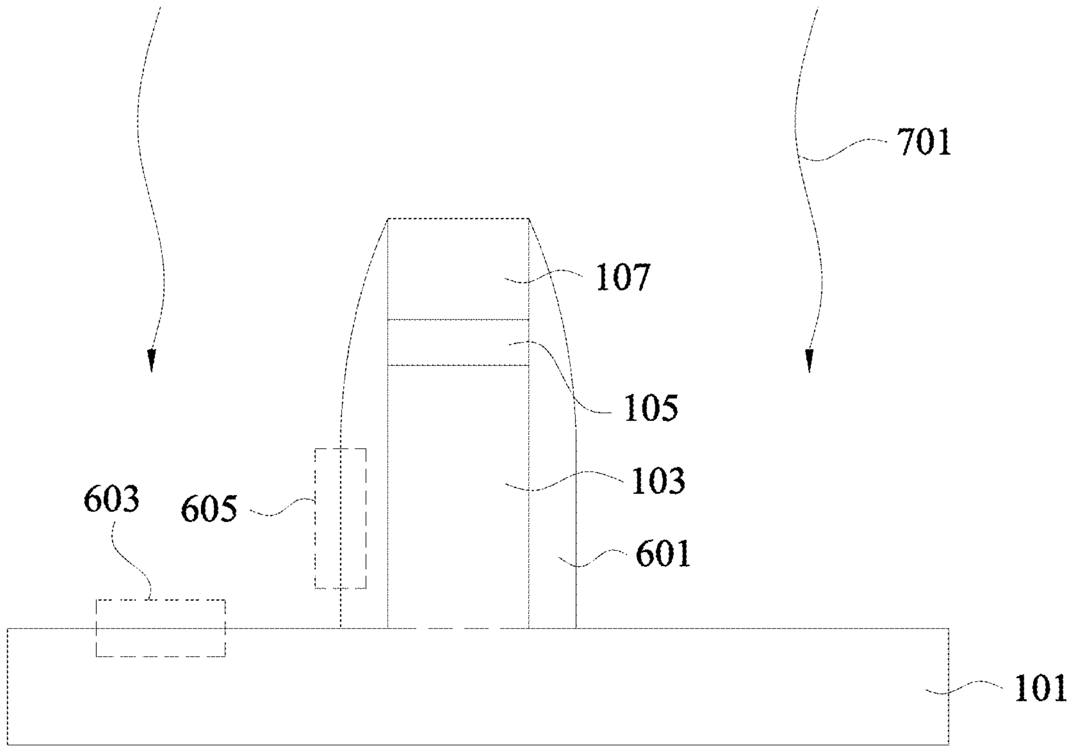
FIGS. 7A-7C illustrate a second treatment in accordance with some embodiments.
Figure 7B:
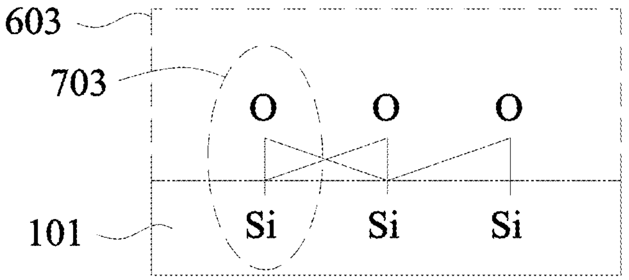
Figure 7C:
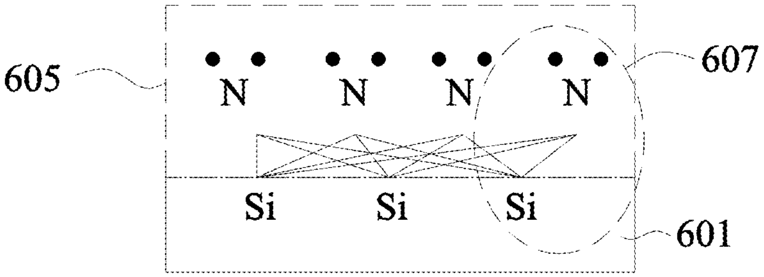

FIGS. 7A-7C illustrate that, after the spacers 601 have been formed, the second treatment (represented in FIG. 7A by the wavy lines labeled 701) may be used to increase the selectivity of growth between the spacers 601 and the substrate 101 in order to have a thicker deposition of the first dielectric layer 501 over the substrate 101 than over the spacers 601. In an embodiment the second treatment 701 may be performed within the treatment and deposition chamber 203 and may be initiated by placing a second treatment precursor chemical (instead of the first treatment precursor chemical) within the third precursor delivery system 208. The second treatment precursor chemical may be a chemical that will react with the first terminal groups 111 of the material of the substrate 101 and modify the first terminal groups 111 into sixth terminal groups (represented in FIG. 7B by the dashed circle labeled 703), which may comprise, e.g., silicon atoms bonded to oxygen atoms. In an embodiment in which the fin 103 and the substrate 101 are silicon and the spacers 601 are silicon nitride, the second treatment precursor chemical may be an oxygen containing precursor, such as $O_2$, $N_2O$, combinations of these, or the like, although any other suitable chemical may also be used either by itself or in combination. In an embodiment the second treatment precursor chemical is not a plasma so as to avoid excessive reactions with the fifth terminal groups 607.

Once the second treatment precursor chemical has been placed into the third precursor delivery system 208, the second treatment 701 may be initiated by the control unit 215 sending an instruction to the precursor gas controller 213 to connect the third precursor delivery system 208 to the treatment and deposition chamber 203. Once connected, the third precursor delivery system 208 can deliver the second treatment precursor chemical ($O_2$) to the showerhead 217 through the precursor gas controller 213 and the manifold 216. The showerhead 217 can then disperse the second treatment precursor chemical into the treatment and deposition chamber 203, wherein the second treatment precursor chemical can react with the exposed first terminal groups 111 of the substrate 101.

In the embodiment to treat the substrate 101 and the fin 103 made of silicon with $O_2$, the second treatment precursor chemical may be flowed into the treatment and deposition chamber 203 at a flow rate of between about 0.2 slm and about 0.5 slm for about 600 seconds. Additionally, the treatment and deposition chamber 203 may be held at a pressure of between about 750 torr and about 770 torr, such as about 760 torr, and a temperature of between about 20° C. and about 60° C., such as about 25° C. However, as one of ordinary skill in the art will recognize, these process conditions are only intended to be illustrative, as any suitable process conditions may be utilized while remaining within the scope of the embodiments.

FIG. 7B illustrates a result of the second treatment 701 at the surface of the substrate 101. In an embodiment in which the substrate 101 is silicon and the second treatment precursor is oxygen, the first terminal groups 111 of hydrogen bonded to the silicon have been modified or replaced during the second treatment 701 with the sixth terminal groups 703 of oxygen bonded to the silicon. As such, the bond dissociation energy of the terminal groups at the surface of the substrate 101 are changed from 298 kJ/mol (for hydrogen bonded to silicon) to 798 kJ/mol (for oxygen bonded to silicon), which moves from below the bond dissociation energy of 439 kJ/mol (for nitrogen bonded to the silicon) for the fifth terminal groups 607 of the spacers 601 to above the fifth terminal groups 607 of the spacers 601.

FIG. 7C illustrates a result of the second treatment 701 at the surface of the spacers 601. In an embodiment in which the spacers 601 are silicon nitride and the second treatment precursor is oxygen, the fifth terminal groups 607 of nitrogen bonded to the silicon is minimally affected, if at all, by the second treatment 701. As such, the fifth terminal groups 607 of nitrogen bonded to the silicon remain while the first terminal groups 111 of the substrate 101 are modified to the sixth terminal groups 703 by the second treatment 701.

Figure 8A:
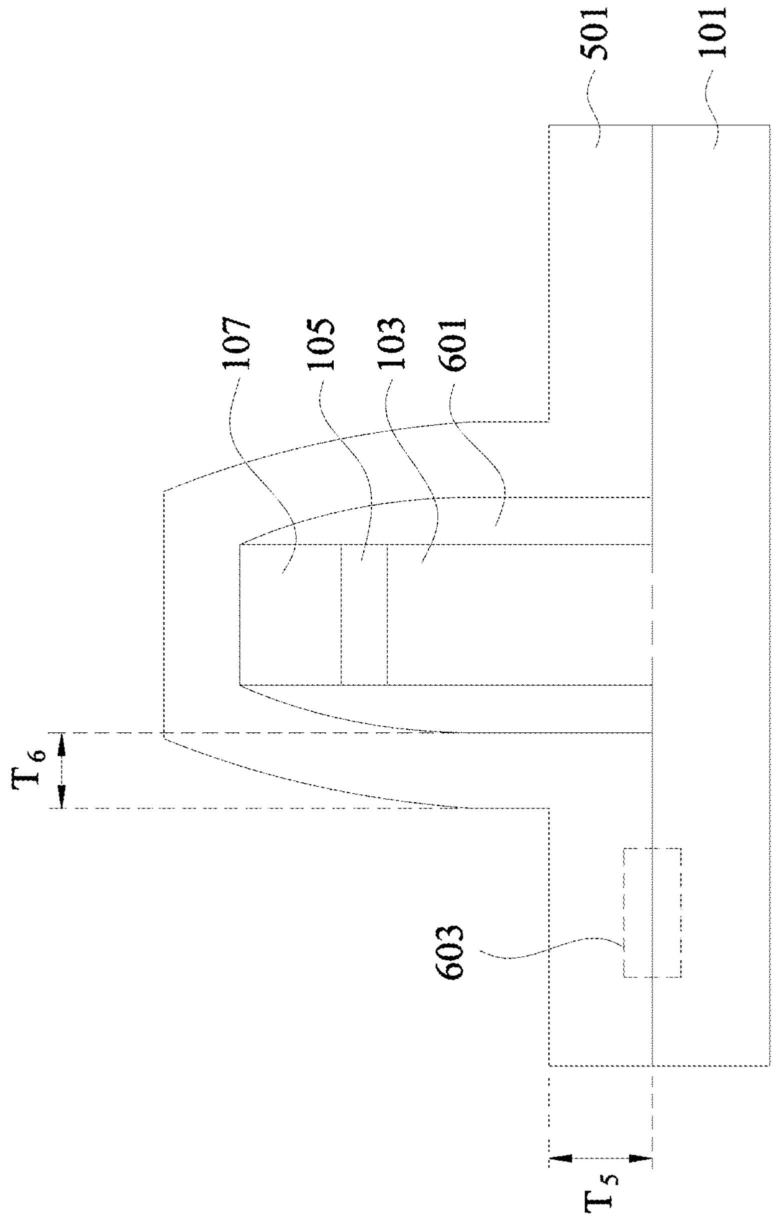
FIGS. 8A-8C illustrate a deposition of the dielectric layer after the second treatment in accordance with some embodiments.
Figure 8B:
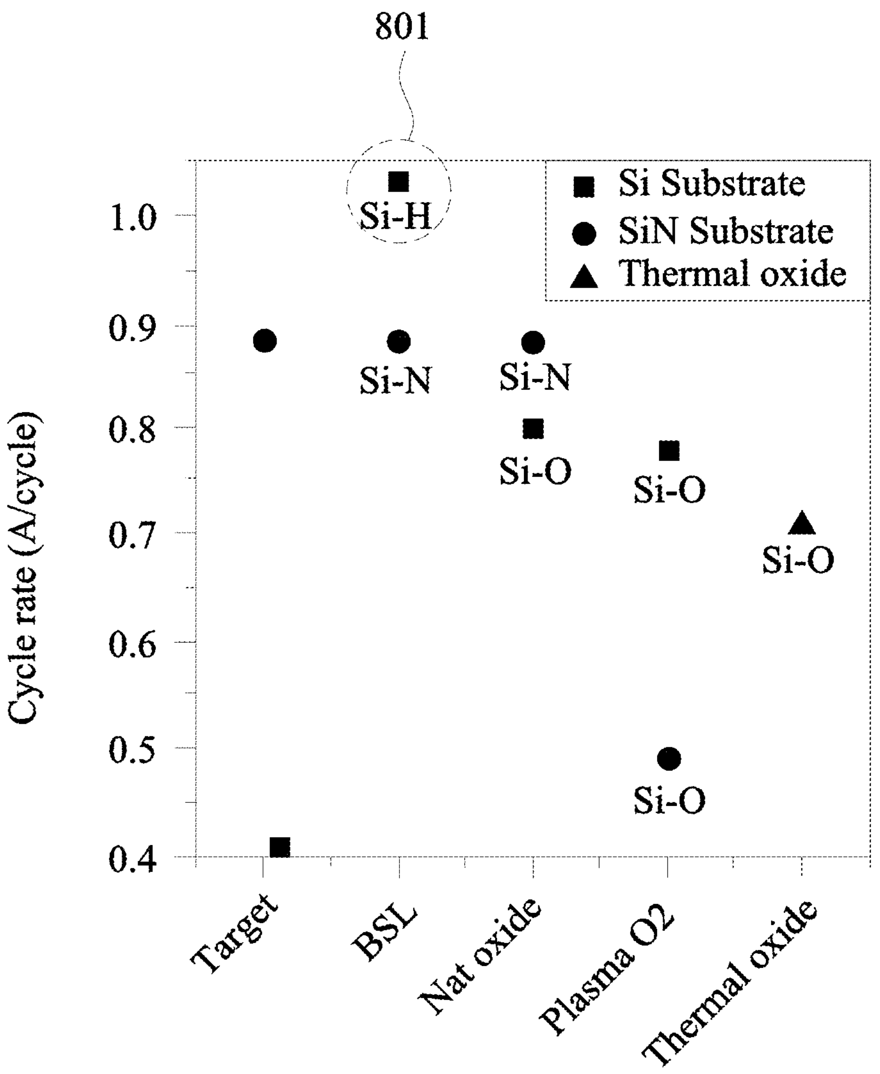

FIGS. 8A-8B illustrate the deposition of the first dielectric layer 501 onto the substrate 101 and the spacers 601 after the second treatment 701. In an embodiment the first dielectric layer 501 may be silicon nitride and may be deposited as described above with respect to FIG. 5. For example, the substrate 101 and spacers 601 may be placed within the treatment and deposition chamber 203 and the control unit 215 will utilize the precursor gas controller 213 to sequentially introduce the first precursor material, purge the treatment and deposition chamber 203, introduce the second precursor material, purge the treatment and deposition chamber 203, and repeat the process to build up successive monolayers of material to form the first dielectric layer 501.

However, because the second treatment 701 has been used to modify the first terminal groups 111 of the substrate 101 into the sixth terminal groups 703, the first dielectric layer 501 will have a larger rate of growth at the surface of the substrate 101 than at the surface of the spacers 601. As such, the portion of the first dielectric layer 501 grown on the substrate 101 may have a fifth thickness $T_5$ of between about 43 Å and about 57 Å, such as about 45 Å, while the first dielectric layer 501 may have a sixth thickness $T_6$ of between about 48 Å and about 52 Å, such as about 50 Å, adjacent to the spacers 601. Such a selective deposition may be achieved without the use of photolithographical processes.

FIG. 8B illustrates a chart showing that the growth rate of the substrate 101 with the first terminal groups 111 (represented in FIG. 8B by the circle labeled 801 at the baseline (BSL)) may be modified to a larger/smaller growth rate by modifying the first terminal groups 111 to the sixth terminal groups 703. As such, the first dielectric layer 501 may have the larger thickness over the substrate 101 than adjacent to the spacers 601 without the use of additional photolithography processes. FIG. 8B additionally illustrates the growth rates after a plasma treatment utilizing oxygen or and a thermal oxidation process, which illustrate an even smaller growth rate.

Figure 8C:
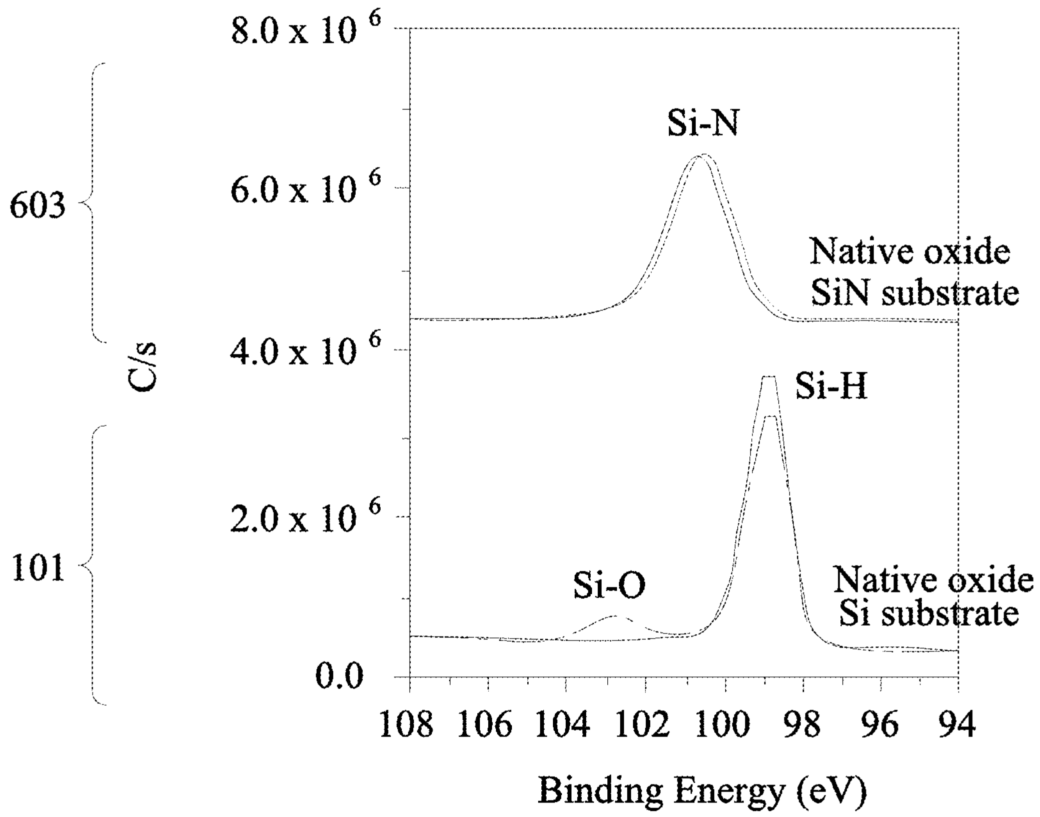

FIG. 8C illustrates a chart of test data illustrating the selectivity of the second treatment 701 using an XPS process to chart the substrate 101 and the spacers 601. In particular, using a long-Q treatment, such as by treating the wafer in a condition such as oxygen gas at room temperature and one atmosphere for a long time such as 6 hours, for the oxidation as described above with respect to the second treatment process 701, the material of the substrate 101 will be modified to include oxygen bonded to silicon while the material of the spacers 601 is not modified. As such, the modification may be performed on the substrate 101 without significant modifications occurring on the spacers 601.

Figure 9A:
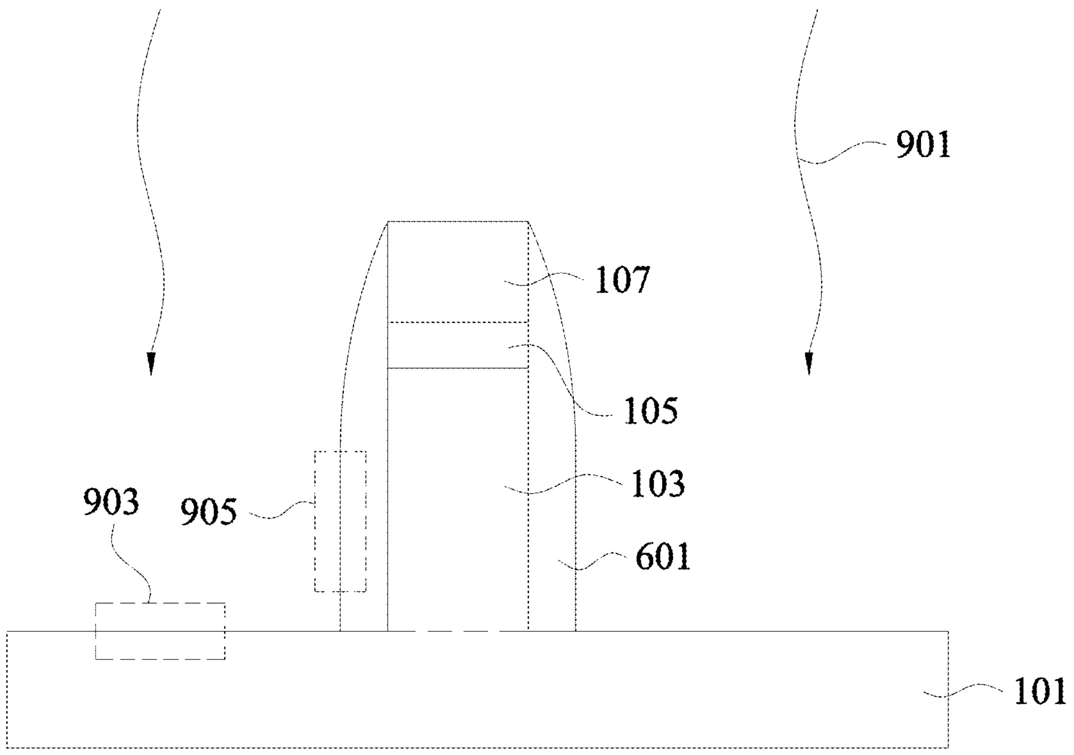
FIGS. 9A-9C illustrate a third treatment in accordance with some embodiments.
Figure 9B:
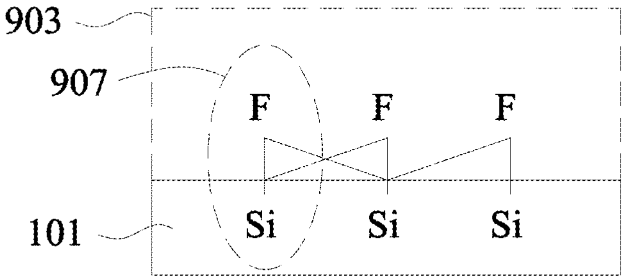
Figure 9C:
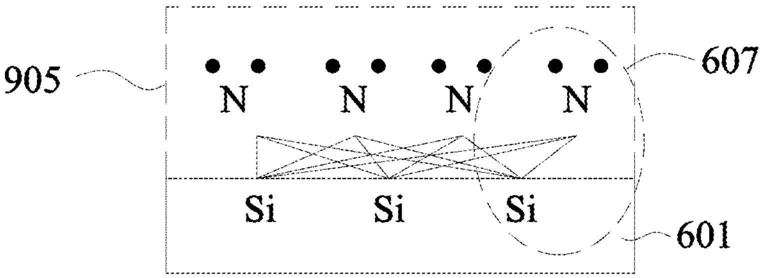

FIGS. 9A-9C illustrate yet another embodiment in which a third treatment (represented in FIG. 9A by the wavy lines labeled 901) is utilized to form a greater selectivity of growth on the substrate 101, with FIG. 9B illustrating a surface of the substrate 101 within the dashed box 903 in FIG. 9A and with FIG. 9C illustrating a surface of the spacers 601 within the dashed box 905 in FIG. 9A. In this embodiment the spacers 601 have been formed adjacent to the fin 103 prior to the third treatment 901, and the spacers 601 may be as described above with respect to FIGS. 6A-6C. In particular the substrate 101 may have the first terminal groups 111 (not separately illustrated in FIGS. 9A-9C) that comprise silicon bonded to hydrogen while the spacers 601 have the fifth terminal groups 607 that comprise silicon bonded to nitrogen.

In an embodiment the third treatment 901 may be performed within the treatment and deposition chamber 203 and may be initiated by placing a third treatment precursor chemical (instead of the first treatment precursor chemical or the second treatment precursor chemical) within the third precursor delivery system 208. The third treatment precursor chemical may be a chemical that will react with the first terminal groups 111 of the material of the substrate 101 and modify the first terminal groups 111 into seventh terminal groups 907 which comprise fluorine atoms bonded to silicon atoms. In an embodiment in which the fin 103 and the substrate 101 are silicon and the spacers 601 are silicon nitride, the third treatment precursor chemical may be a fluorine containing precursor such as $F_2$, $SF_6$, combinations of these, or the like, although any other suitable chemical may also be used either by itself or in combination.

Once the third treatment precursor chemical has been placed into the third precursor delivery system 208, the third treatment 901 may be initiated by the control unit 215 sending an instruction to the precursor gas controller 213 to connect the third precursor delivery system 208 to the treatment and deposition chamber 203. Once connected, the third precursor delivery system 208 can deliver the third treatment precursor chemical (e.g., the $F_2$) to the showerhead 217 through the precursor gas controller 213 and the manifold 216. The showerhead 217 can then disperse the third treatment precursor chemical into the treatment and deposition chamber 203, wherein the third treatment precursor chemical can react to the exposed first terminal groups 111 of the surface of the substrate 101.

In the embodiment to treat the first terminal groups 111 of the substrate 101 and the fin 103 made of silicon with $F_2$, the third treatment precursor chemical may be flowed into the treatment and deposition chamber 203 at a flow rate of between about 1 slm and about 3 slm for about 600 second. Additionally, the treatment and deposition chamber 203 may be held at a pressure of about 0 torr, and a temperature of between about 400° C. and about 500° C., such as about 450° C. However, as one of ordinary skill in the art will recognize, these process conditions are only intended to be illustrative, as any suitable process conditions may be utilized while remaining within the scope of the embodiments.

FIG. 9B illustrates a result of the third treatment 901 at the surface of the substrate 101. In an embodiment in which the first terminal groups 111 at the surface of the substrate 101 comprise silicon bonded to hydrogen and the third treatment precursor is fluorine, the first terminal group 111 of hydrogen bonded to the silicon has been modified during the third treatment 901 into the seventh terminal groups 907 which comprise fluorine atoms bonded to silicon atoms. As such, the bond dissociation energy at the terminal groups at the surface of the substrate 101 changes from 298 kJ/mol (for the first terminal groups 111 of hydrogen bonded to silicon) to 565 kJ/mol (for the seventh terminal groups 907 of fluorine bonded to silicon), which moves the bond dissociation energy from below the bond dissociation energy of 439 kJ/mol of the fifth terminal groups 607 (for nitrogen bonded to the silicon on the spacers 601) to above the bond dissociation energy of the fifth terminal groups 607 of the spacers 601.

FIG. 9C illustrates a result of the third treatment 901 at the surface of the spacers 601. In an embodiment in which the spacers 601 are silicon nitride and the third treatment precursor is fluorine, the fifth terminal group 607 of nitrogen bonded to the silicon is minimally affected, if at all, by the third treatment 901. As such, the fifth terminal groups 607 of nitrogen bonded to the silicon remain while the first terminal groups 111 at the surface of the substrate 101 are adjusted by the third treatment 901.

Figure 10A:
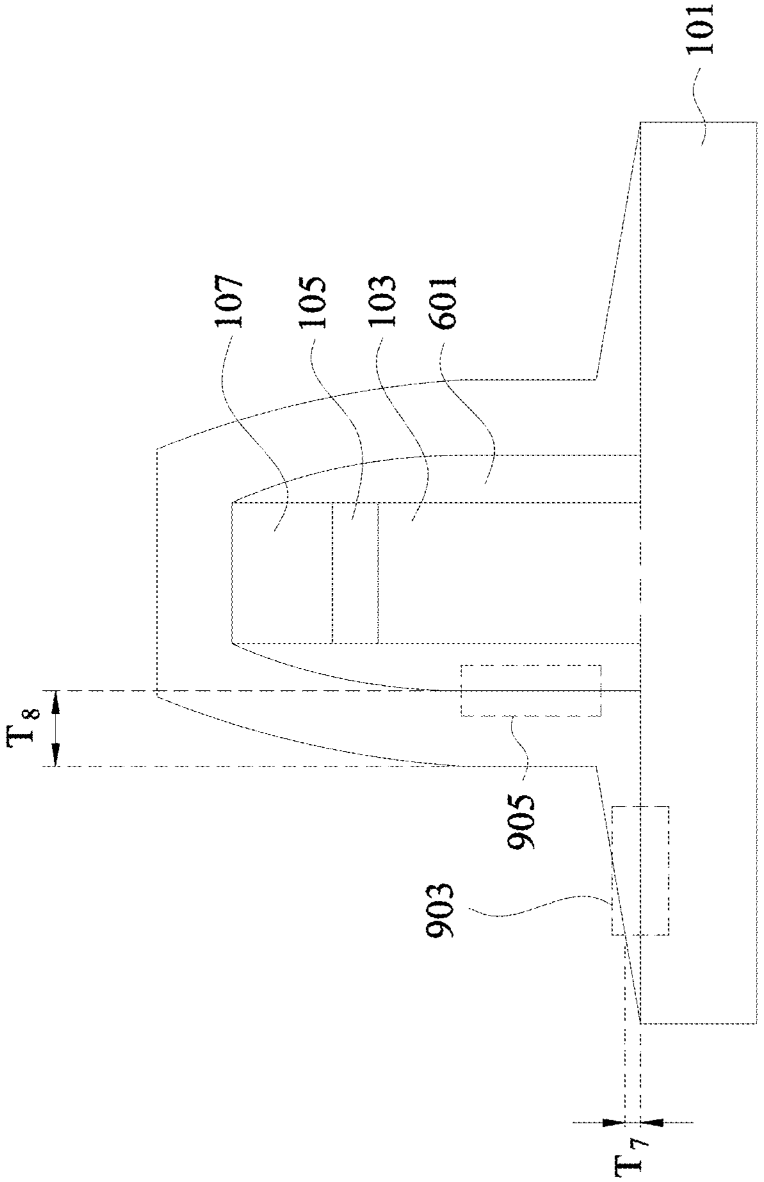
FIGS. 10A-10D illustrate a deposition of the dielectric layer after the third treatment in accordance with some embodiments.
Figure 10B:
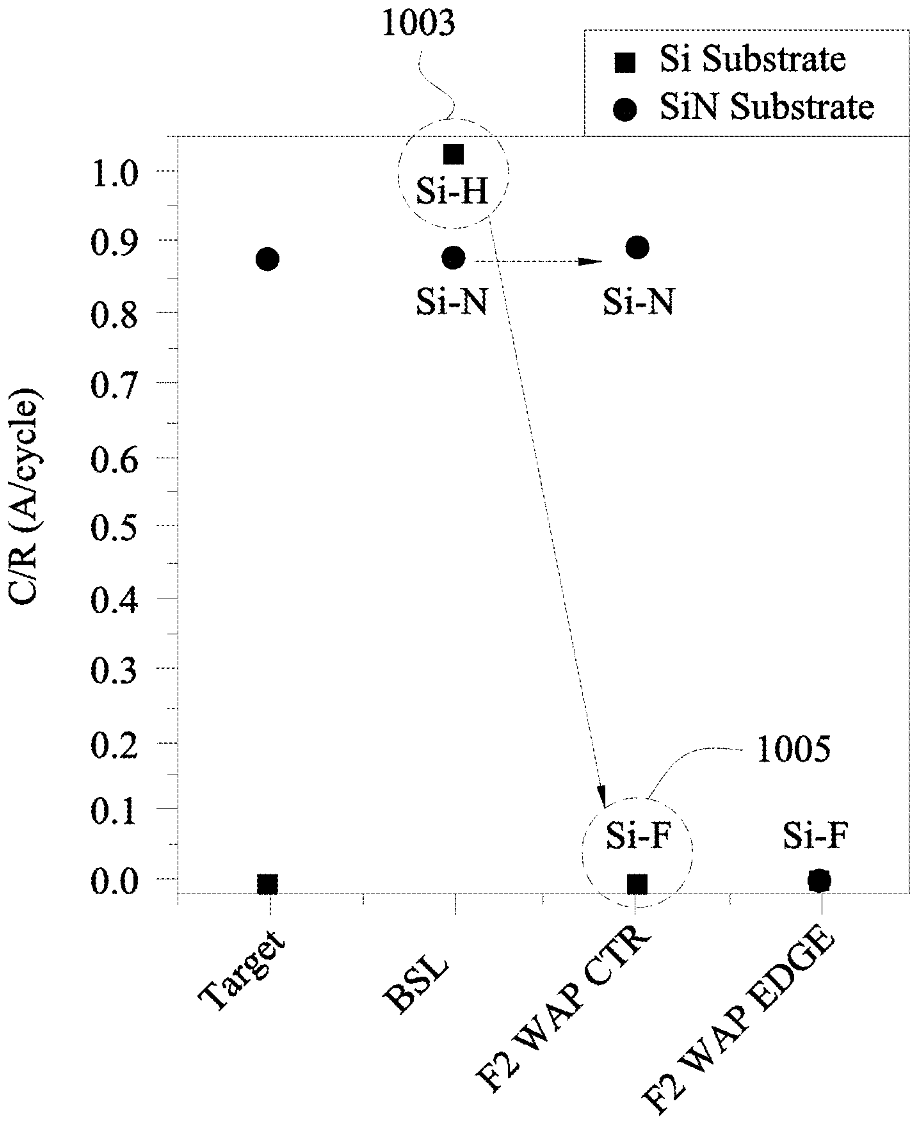

FIGS. 10A-10B illustrate the deposition of the first dielectric layer 501 onto the substrate 101 and the spacers 601 after the third treatment 901. In an embodiment the first dielectric layer 501 may be silicon nitride and may be deposited as described above with respect to FIG. 5. For example, the substrate 101 and spacers 601 may be within the treatment and deposition chamber 203 and the control unit 215 will utilize the precursor gas controller 213 to sequentially introduce the first precursor material, purge the treatment and deposition chamber 203, introduce the second precursor material, purge the treatment and deposition chamber 203, and repeat the process to build up successive monolayers of material to form the first dielectric layer 501.

However, because the third treatment 901 has been used to modify the first terminal groups 111 of the substrate 101 into the seventh terminal groups 907, the first dielectric layer 501 will grow at a slower rate of growth (or will not grow at all) on the surface of the substrate 101 than at the surface of the spacers 601. As such, the portion of the first dielectric layer 501 grown on the substrate 101 may have a seventh thickness $T_7$ of less than about 10 Å, such as about 0 Å, while the first dielectric layer 501 may have an eighth thickness $T_8$ of between about 48 Å and about 52 Å, such as about 50 Å, adjacent to the spacers 601.

In particular, as illustrated in FIG. 10B, the original first terminal groups 111 that terminate the material of the substrate 101 (e.g., the silicon-hydrogen bonds illustrated by the dashed circle 1003 on the baseline (BSL)) will have a cycle growth rate (in A/cycle) of over 1.0 Å/cycle. However, by performing the third treatment 901, the first terminal groups 111 may be modified to the seventh terminal groups 907 (e.g., the silicon-fluorine bonds illustrated by the dashed circle 1005), which has a cycle growth rate of almost zero, whether it occurs at the center (CTR) of the test wafer or at the edge of the test wafer (EDGE). As such, a selective deposition of the first dielectric layer 501 may be obtained, wherein the first dielectric layer 501 grows on the spacers 601 but does not grow, or only minimally grows, on the substrate 101, and the presence of the first dielectric layer 501 may be obtained on the spacers 601 and not on the substrate 101 without a separate photolithography process.

Figure 10C:
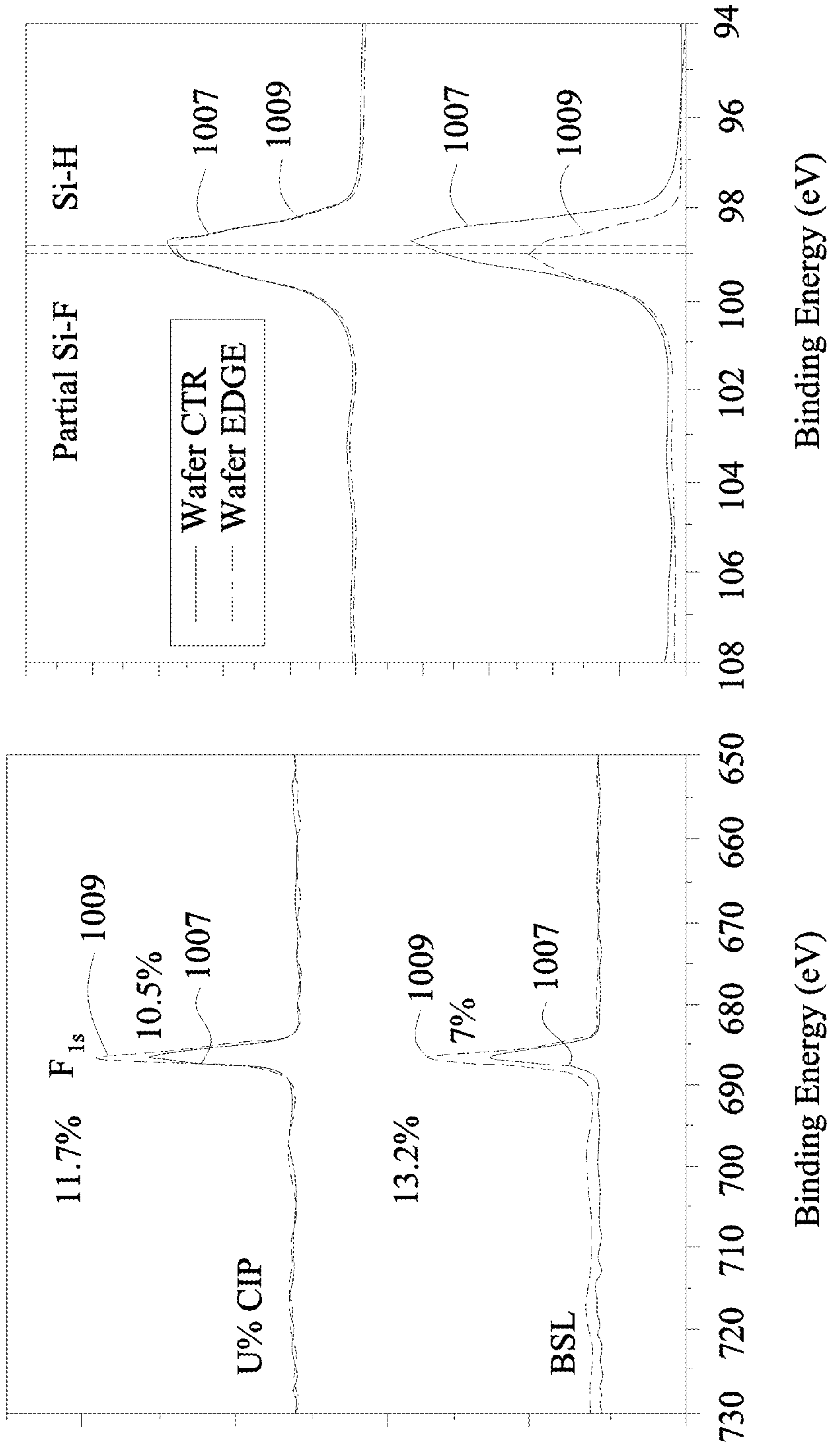
Figure 10D:
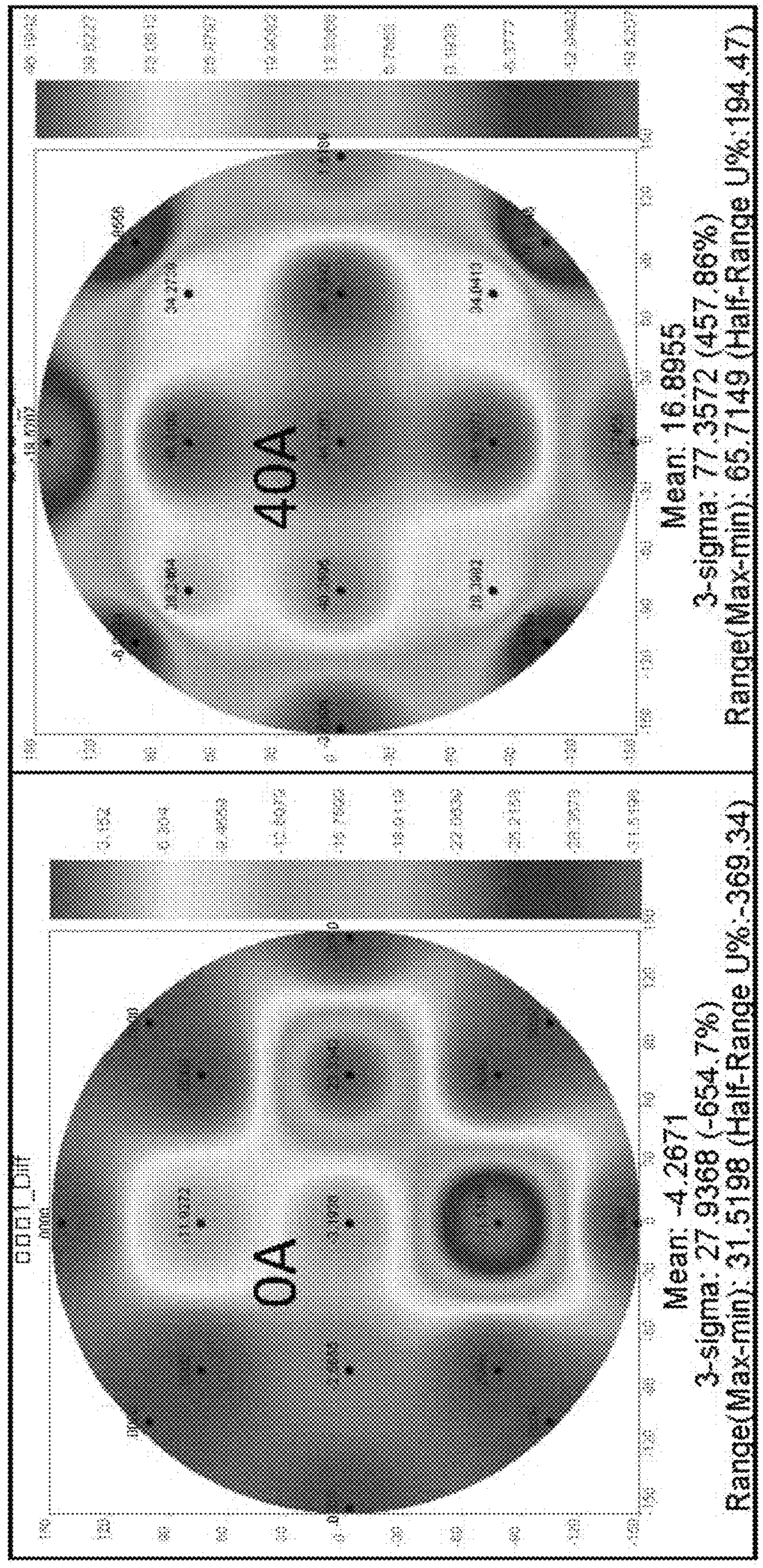

FIGS. 10C-10D illustrate additional data showing the selective growth of silicon nitride on a silicon substrate and spacers that have been treated with $F_2$. FIG. 10C illustrates two types of treatment, one in which the treatment with $F_2$ is performed over the entire wafer (represented as Wafer Center (CTR) and represented by the line labeled 1007), and one in which the treatment is performed only on the side edges of the wafer (represented as Wafer EDGE and represented by the line labeled 1009). In an embodiment the side edges may be treated by stacking multiple wafers or dummy wafers into a wafer boat such that the top surfaces are covered and only the side surfaces of the wafers are exposed, while the treatment over the center may be performed by placing the wafers apart from each other such that the centers of the wafers are exposed. As can be seen, the treatment with $F_2$ will cause a decrease in the number of silicon-hydrogen bonds for a U % CIP (wafer treatment uniformity improvement) from the baseline (along with an increase in the number of silicon fluorine bonds).

FIG. 10D illustrates a map of both a silicon wafer (on the left hand side of FIG. 10D) and a silicon nitride wafer (on the right hand side of FIG. 10D) that have been treated with $F_2$ and then had a deposition process of silicon nitride performed. As can be seen, the silicon substrate shows very little if any growth of silicon nitride. However, the silicon nitride substrate shows a growth of about 40 Å. As such, the deposition of silicon nitride may be performed selectively to the silicon nitride material and not on the silicon material.

In accordance with an embodiment, a method of manufacturing a semiconductor device comprising forming a mask layer over and in physical contact with a fin, wherein the fin comprises first terminal groups and the mask layer comprises second terminal groups different from the first terminal groups is provided. The first terminal groups are treated to form third terminal groups, wherein the third terminal groups are the same as the second terminal groups. A first deposition precursor is introduced to the third terminal groups and the second terminal groups and the first deposition precursor is removed from the third terminal groups and the second terminal groups. A second deposition precursor different from the first deposition precursor is introduced after the removing the first deposition precursor, wherein the introducing the first deposition precursor and the introducing the second deposition precursor form a first material.

In accordance with another embodiment, a method of manufacturing a semiconductor device comprising forming a spacer over a substrate, wherein the substrate comprises a first material that has a first atomic layer deposition growth rate and wherein the spacer comprises a second material with a second atomic layer deposition growth rate different from the first atomic layer deposition growth rate is provided. The first atomic layer deposition growth rate is adjusted to a third atomic layer deposition growth rate, and a dielectric layer is deposited after the adjusting the first atomic layer deposition growth rate.

In accordance with yet another embodiment, a method of manufacturing a semiconductor device the method comprising depositing a second material on a substrate, the substrate comprising a first material, the second material being different from the first material, is provided. A fin is formed from the substrate after the depositing the second material on the substrate. The first material is treated with a first treatment precursor after the forming the fin, the first treatment precursor modifying a first terminal group of the first material into a second terminal group without modifying a third terminal group of the second material. A dielectric layer is deposited on the first material and the second material, wherein the depositing the dielectric layer further comprises reacting the second terminal group and the third terminal group with a first deposition precursor to form a product group and reacting the product group with a second deposition precursor after the first deposition precursor has been removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
- depositing a mask over a semiconductor substrate;
- using the mask to form a fin from the semiconductor substrate, the fin comprising a first sidewall;
- after the using the mask to form the fin, treating exposed surfaces to reduce an atomic deposition growth rate difference of a dielectric material between the mask and the fin, wherein the treating exposed surfaces is performed at a pressure of between about 1 mtorr and about 5 mtorr; and
- depositing the dielectric material on the first sidewall and the mask using an atomic layer deposition process.

2. The method of claim 1, wherein the depositing the mask comprises depositing silicon nitride.

3. The method of claim 2, wherein the treating exposed surfaces introduces $NF_3$ to the exposed surfaces.

4. The method of claim 1, wherein the treating exposed surfaces introduces $NH_3$ to the exposed surfaces.

5. The method of claim 1, wherein the treating exposed surfaces introduces $N_2O$ to the exposed surfaces.

6. The method of claim 1, wherein the treating exposed surfaces is performed at a temperature of between about 200° C. and about 300° C.

7. A method of manufacturing a semiconductor device, the method comprising:
- providing a fin over a substrate, the fin comprising:
  - a first semiconductor fin;
  - a first mask over the first semiconductor fin;
  - a second mask over the first mask, the second mask being a different material than the first mask;
- treating each of the first semiconductor fin, the first mask, and the second mask to minimize differences in atomic layer deposition rates of a first dielectric material, wherein the treating forms $SiNF_2$; and
- after the treating, depositing the first dielectric material using an atomic layer deposition process.

8. The method of claim 7, wherein the first mask comprises silicon nitride.

9. The method of claim 8, wherein the second mask comprises silicon oxide.

10. The method of claim 7, further comprising etching the first dielectric material to form spacers adjacent to the fin.

11. The method of claim 7, wherein the depositing the first dielectric material introduces dichlorosilane to the fin.

12. The method of claim 7, wherein the depositing the first dielectric material introduces monochlorosilane to the fin.

13. The method of claim 11, wherein the depositing the first dielectric material introduces ammonia ($NH_3$) to the fin.

14. A method of manufacturing a semiconductor device, the method comprising:
- depositing silicon nitride onto a semiconductor substrate;
- patterning the silicon nitride and the semiconductor substrate to form a fin, the fin comprising both silicon nitride and silicon;
- adding nitrogen to the silicon without significantly reacting with the silicon nitride to reduce an atomic deposition growth rate to below 1 Å/cycle, wherein after the adding nitrogen the fin has terminal groups which are the same across the silicon nitride and the silicon; and
- reacting a precursor with the terminal groups to deposit a dielectric material on both the silicon nitride and the silicon.

15. The method of claim 14, wherein the patterning the silicon nitride and the semiconductor substrate comprises depositing silicon oxide over the silicon nitride.

16. The method of claim 14, wherein the adding nitrogen comprises exposing the silicon to $NF_3$.

17. The method of claim 14, wherein the adding nitrogen comprises exposing the silicon to $NH_3$.

18. The method of claim 14, wherein the adding nitrogen comprises exposing the silicon to $N_2O$.

19. The method of claim 14, wherein the adding nitrogen forms a $SiNF_2$ compound.

20. The method of claim 14, wherein the adding nitrogen is performed at a pressure of between about 1 mtorr and about 5 mtorr.

* * * * *